US012598804B2

(12) United States Patent
Jung et al.

(10) Patent No.: US 12,598,804 B2
(45) Date of Patent: Apr. 7, 2026

(54) INTEGRATED CIRCUIT DEVICE

(71) Applicant: Samsung Electronics Co., Ltd.,
Suwon-si (KR)

(72) Inventors: Yeondo Jung, Suwon-si (KR); Chul Kim, Suwon-si (KR); Kichul Kim, Suwon-si (KR); Gwirim Park, Suwon-si (KR); Haejun Yu, Swuon-si (KR); Chaeyeong Lee, Suwon-si (KR); Kyungin Choi, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 298 days.

(21) Appl. No.: 18/300,867

(22) Filed: Apr. 14, 2023

(65) Prior Publication Data

US 2024/0088150 A1     Mar. 14, 2024

(30) Foreign Application Priority Data

Sep. 8, 2022     (KR) ........................ 10-2022-0114467

(51) Int. Cl.
| | |
|---|---|
| *H10D 84/85* | (2025.01) |
| *H10D 30/43* | (2025.01) |
| *H10D 30/67* | (2025.01) |
| *H10D 62/10* | (2025.01) |
| *H10D 64/01* | (2025.01) |

(52) U.S. Cl.
CPC ............. *H10D 84/85* (2025.01); *H10D 30/43* (2025.01); *H10D 30/6735* (2025.01); *H10D 30/6757* (2025.01); *H10D 62/121* (2025.01); *H10D 64/017* (2025.01)

(58) Field of Classification Search
CPC ............ H10D 30/014; H10D 30/6735; H10D 30/6757; H10D 30/43; H10D 30/797; H10D 62/121; H10D 62/115; H10D 62/822; H10D 84/85; H10D 84/0151; H10D 84/038; H10D 64/017
See application file for complete search history.

(56) References Cited

U.S. PATENT DOCUMENTS

| | | | |
|---|---|---|---|
| 7,884,032 B2 | 2/2011 | Ye et al. | |
| 9,412,616 B1 | 8/2016 | Xie et al. | |
| 10,665,669 B1 | 5/2020 | Xie et al. | |
| 2019/0312034 A1* | 10/2019 | Lee ...................... | H10D 84/834 |
| 2020/0006559 A1 | 1/2020 | Mehandru et al. | |
| 2020/0043929 A1* | 2/2020 | Hwang .................. | H10D 89/10 |
| 2020/0075331 A1 | 3/2020 | Noh et al. | |
| 2020/0381426 A1 | 12/2020 | Xu et al. | |

(Continued)

*Primary Examiner* — Vongsavanh Sengdara
(74) *Attorney, Agent, or Firm* — Wolf, Greenfield & Sacks, P.C.

(57) ABSTRACT

An integrated circuit device includes a pair of fin-type active regions, which extend in a first horizontal direction on a substrate, and a fin isolation insulator between ones of the pair of fin-type active regions to extend in a second horizontal direction that intersects with the first horizontal direction. The fin isolation insulator includes a first nitrogen-rich barrier film having at least one protrusion at a position that is higher than respective top surfaces of each of the pair of fin-type active regions with respect to the substrate, and a second nitrogen-rich barrier film, which is spaced apart from the first nitrogen-rich barrier film and is in a space defined by the first nitrogen-rich barrier film.

19 Claims, 25 Drawing Sheets

(56) References Cited

U.S. PATENT DOCUMENTS

| | | | |
|---|---|---|---|
| 2021/0036121 A1* | 2/2021 | Lim | H10D 62/151 |
| 2021/0126113 A1 | 4/2021 | Lin et al. | |
| 2022/0037315 A1 | 2/2022 | Chuang et al. | |
| 2022/0367286 A1* | 11/2022 | Ko | H01L 21/76229 |
| 2022/0392797 A1* | 12/2022 | Yu | H10D 84/0151 |
| 2023/0014468 A1* | 1/2023 | Park | H10D 84/038 |
| 2023/0065498 A1* | 3/2023 | Wu | H10D 84/834 |
| 2023/0326799 A1* | 10/2023 | More | H10D 30/024 |
| | | | 257/384 |

* cited by examiner

X1 – X1'

X1 – X1'

X1 – X1'

X1 – X1'

X1 – X1'

INTEGRATED CIRCUIT DEVICE

CROSS-REFERENCE TO RELATED APPLICATION

This application is based on and claims priority under 35 U.S.C. § 119 to Korean Patent Application No. 10-2022-0114467, filed on Sep. 8, 2022, in the Korean Intellectual Property Office, the disclosure of which is incorporated by reference herein in its entirety.

BACKGROUND

The inventive concept relates to a method of fabricating an integrated circuit device, and more particularly, to an integrated circuit device including a fin-type active region.

Along with the rapid down-scaling of integrated circuit devices, integrated circuit devices need to secure accuracy in operations as well as fast operation speeds. Therefore, research is being conducted to provide integrated circuit devices having structures that may provide improved performance and improved reliability thereof.

SUMMARY

The inventive concept provides an integrated circuit device having a structure allowing the reliability thereof to be improved even when, along with the down-scaling, the area of a device area of the integrated circuit device is reduced and aspect ratios of components in the device area are increased.

According to some embodiments of the inventive concept, there is provided an integrated circuit device including a pair of fin-type active regions, which extend in a first horizontal direction on a substrate, and a fin isolation insulator between ones of the pair of fin-type active regions to extend in a second horizontal direction that intersects with the first horizontal direction. The fin isolation insulator includes a first nitrogen-rich barrier film having at least one protrusion at a position that is higher than respective top surfaces of each of the pair of fin-type active regions with respect to the substrate, and a second nitrogen-rich barrier film, which is spaced apart from the first nitrogen-rich barrier film and is in a space defined by the first nitrogen-rich barrier film.

According to some embodiments of the inventive concept, there is provided an integrated circuit device including a pair of fin-type active regions, which extend in a first horizontal direction on a substrate, a fin isolation insulator between ones of the pair of fin-type active regions and extends in a second horizontal direction that intersects with the first horizontal direction, a pair of nanosheet stacks on respective ones of the pair of fin-type active regions and each including at least one nanosheet, a pair of gate lines on the respective ones of the pair of fin-type active regions to surround the at least one nanosheet in plan view and extend in the second horizontal direction, and a pair of source/drain regions respectively on both sides of the fin isolation insulator between the pair of gate lines, wherein the fin isolation insulator includes a first nitrogen-rich barrier film including a first local region that has at least one protrusion facing at least one of the pair of source/drain regions, and a second nitrogen-rich barrier film, which is spaced apart from the first nitrogen-rich barrier film and in a space defined by the first nitrogen-rich barrier film.

According to some embodiments of the inventive concept, there is provided an integrated circuit device including a first fin-type active region and a second fin-type active region, which extend in a first horizontal direction on a substrate, a fin isolation insulator between the first fin-type active region and the second fin-type active region extends in a second horizontal direction that intersects with the first horizontal direction, at least one nanosheet on the first fin-type active region, a gate line on the first fin-type active region to surround the at least one nanosheet in plan view and extends in the second horizontal direction, and a source/drain region on the first fin-type active region between the gate line and the fin isolation insulator, wherein the fin isolation insulator includes a first nitrogen-rich barrier film, a first isolation insulating film, a second nitrogen-rich barrier film, and a second isolation insulating film, which are sequentially stacked from an outermost portion of the fin isolation insulator toward a central portion of the fin isolation insulator, the first nitrogen-rich barrier film has at least one protrusion in a local region thereof facing the source/drain region, and the second nitrogen-rich barrier film is spaced apart from the first nitrogen-rich barrier film with the first isolation insulating film therebetween, and has a smooth surface facing the local region of the first nitrogen-rich barrier film.

BRIEF DESCRIPTION OF THE DRAWINGS

Embodiments will be more clearly understood from the following detailed description taken in conjunction with the accompanying drawings in which.

DETAILED DESCRIPTION

Figure 1:
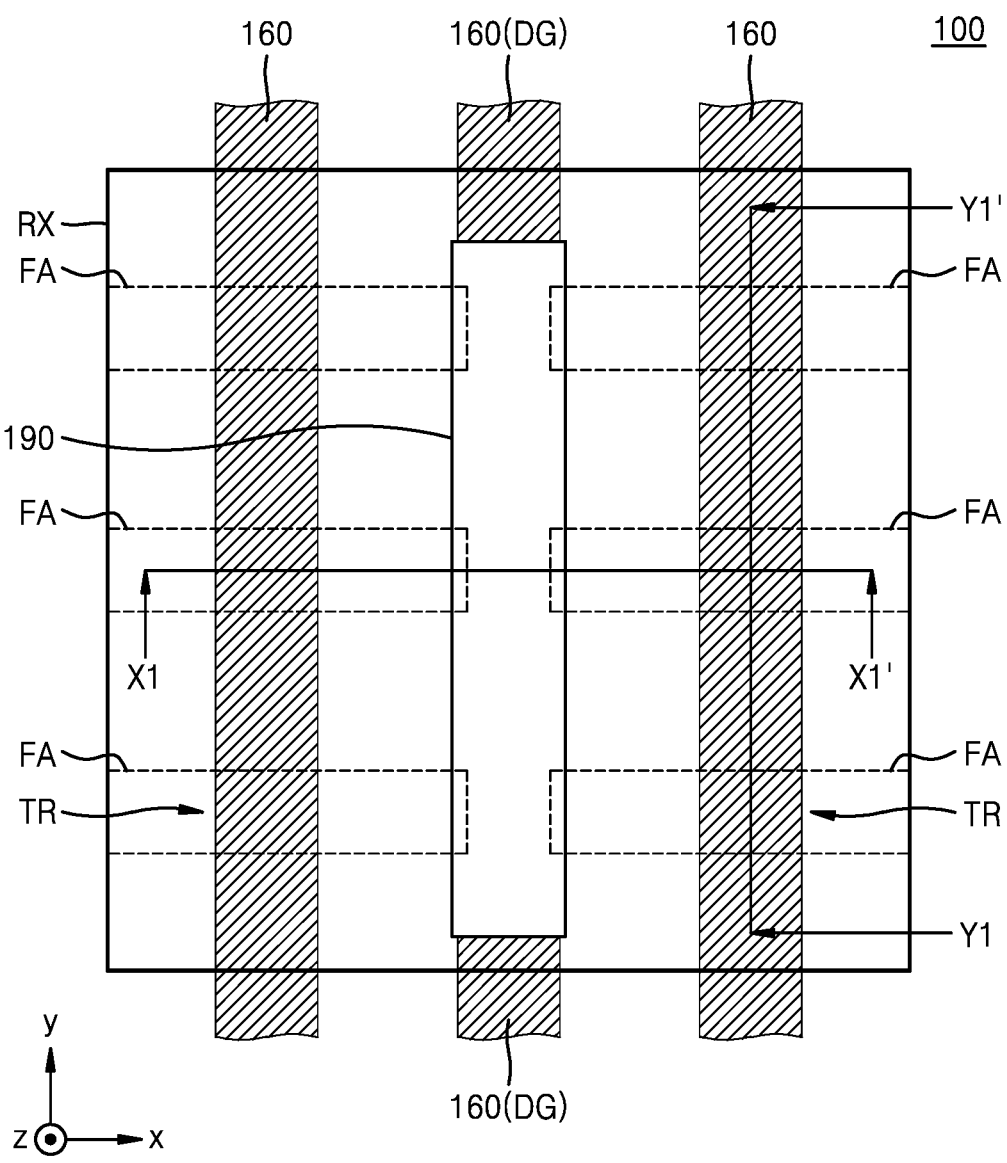
FIG. 1 is a planar layout diagram illustrating a configuration of a portion of an integrated circuit device according to some embodiments.

Hereinafter, embodiments of the inventive concept will be described in detail with reference to the accompanying drawings. Like components are denoted by like reference numerals throughout the specification, and repeated descriptions thereof are omitted.

Figure 2A:
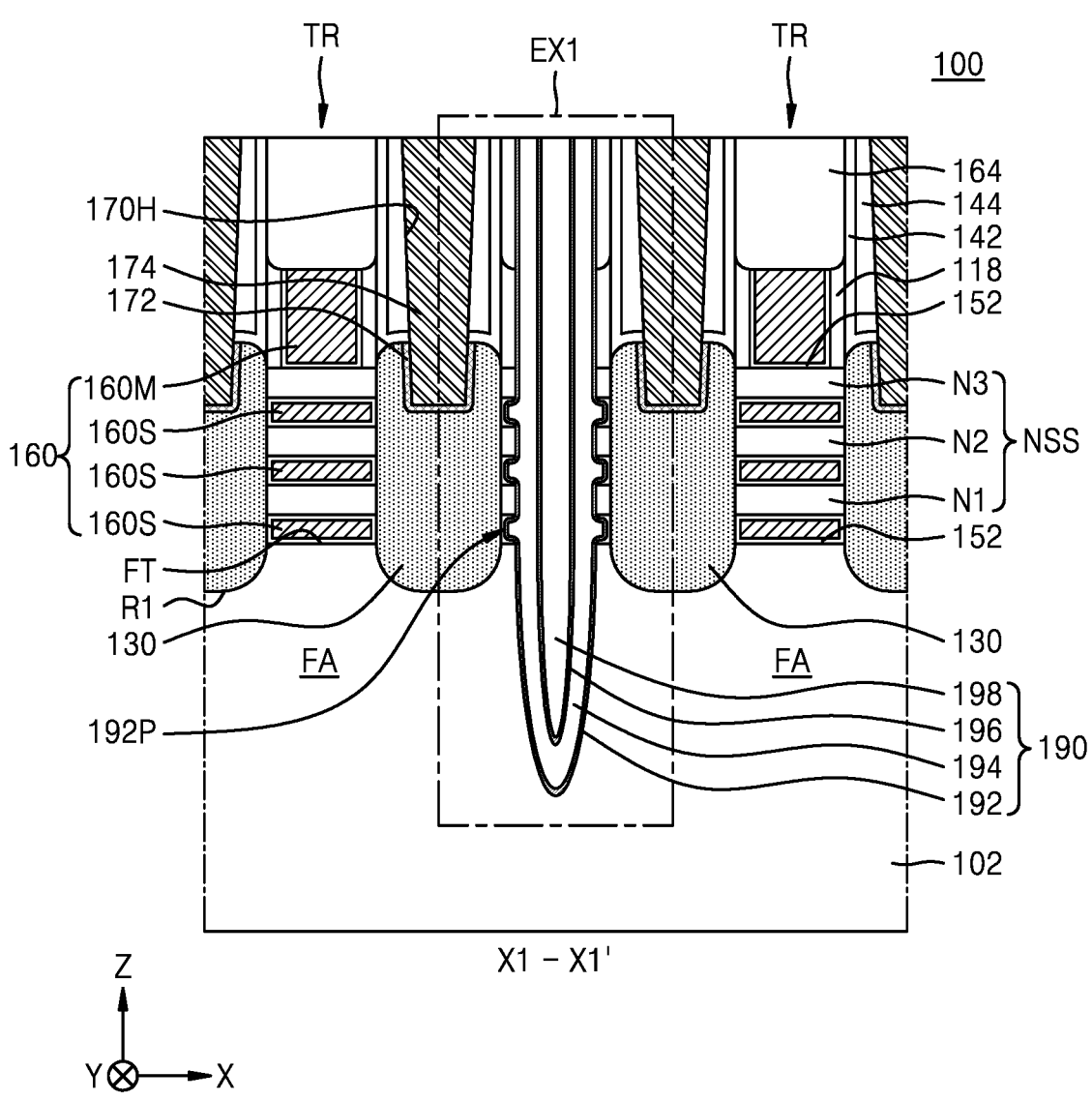
FIG. 2A is a cross-sectional view of the integrated circuit device, taken along a line X1-X1' of FIG. 1.
Figure 2B:
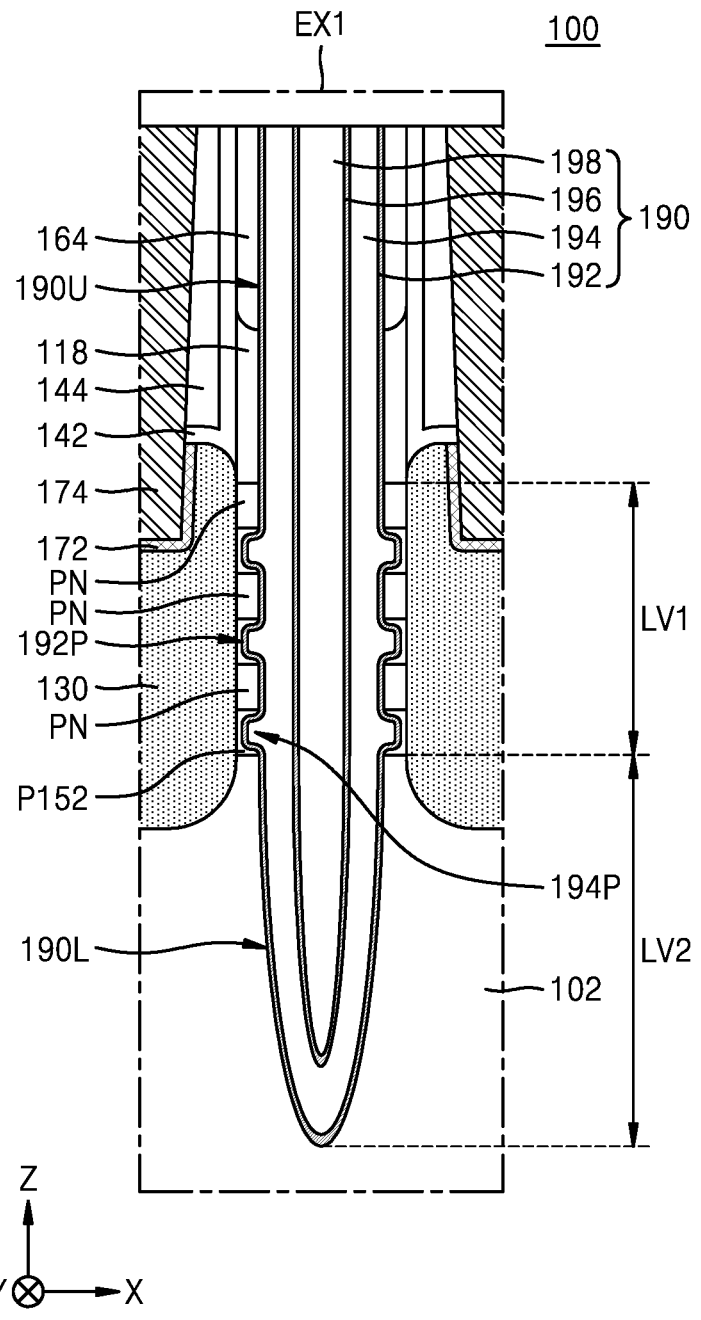
FIG. 2B is an enlarged cross-sectional view of a local region EX1 in FIG. 2A.
Figure 2C:
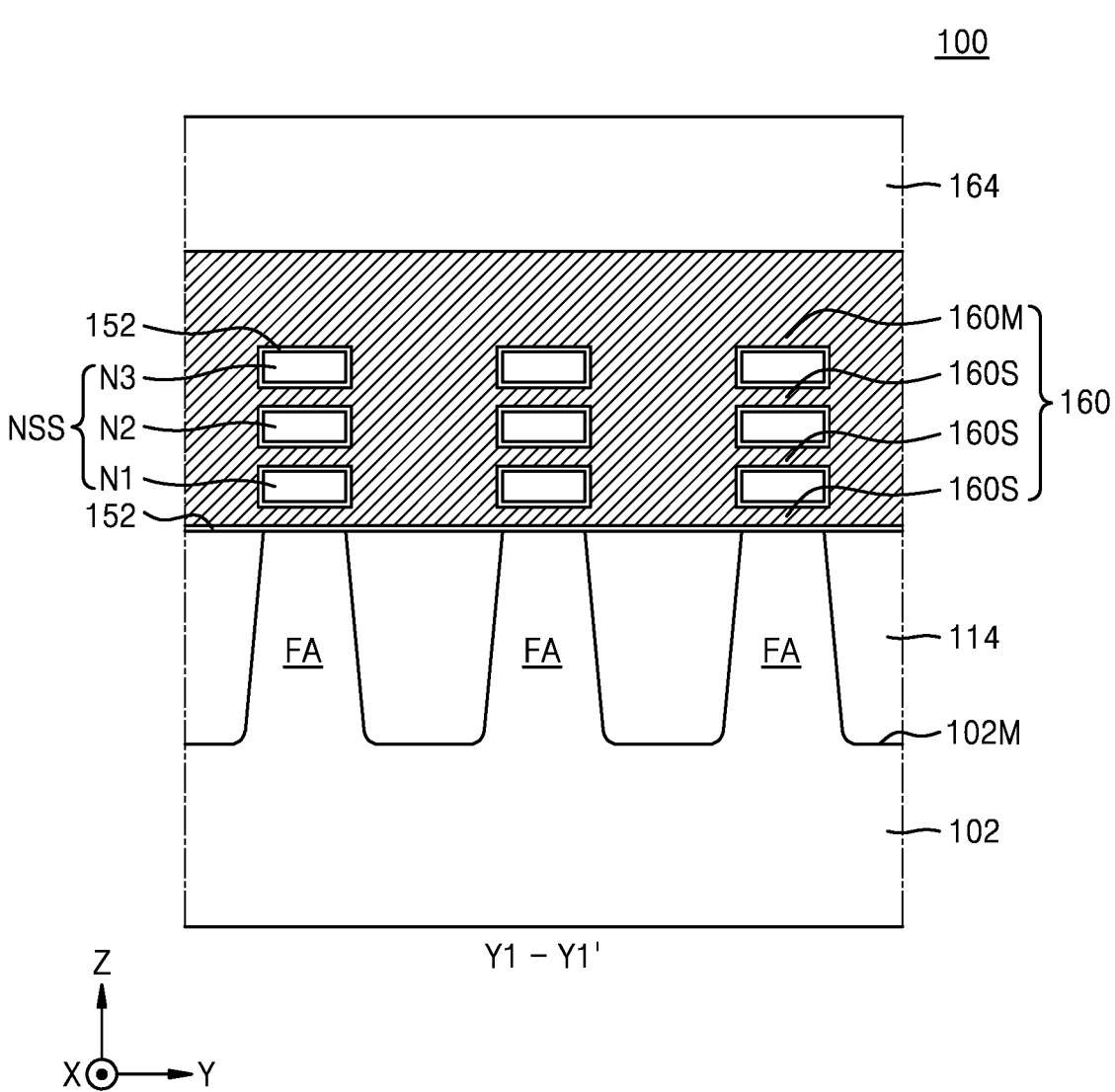
FIG. 2C is a cross-sectional view of the integrated circuit device, taken along a line Y1-Y1' of FIG. 1.

FIG. 1 is a planar layout diagram illustrating a configuration of a portion of an integrated circuit device according to some embodiments. FIG. 2A is a cross-sectional view of the integrated circuit device, taken along a line X1-X1' of FIG. 1. FIG. 2B is an enlarged cross-sectional view of a local region EX1 in FIG. 2A. FIG. 2C is a cross-sectional view of the integrated circuit device, taken along a line Y1-Y1' of FIG. 1. An integrated circuit device 100 including a field-effect transistor TR having a gate-all-around structure, which includes a nanowire or nanosheet-shaped active region and a gate surrounding the active region, is described with reference to FIGS. 1 and 2A to 2C.

Referring to FIGS. 1 and 2A to 2C, the integrated circuit device 100 may include a device area RX arranged on a substrate 102.

The substrate 102 may have a main surface 102M extending in a horizontal direction (X-Y plane direction). The substrate 102 may include a semiconductor, such as Si or Ge, or a compound semiconductor, such as SiGe, SiC, GaAs, InAs, InGaAs, or InP. As used herein, each of the terms "SiGe", "SiC", "GaAs", "InAs", "InGaAs", and "InP" refers to a material including elements contained in each term and is not a chemical formula representing a stoichiometric relationship. The substrate 102 may include a conductive region, for example, an impurity-doped well or an impurity-doped structure.

A fin-type active region FA, which protrudes in a vertical direction from the substrate 102, may be arranged in the device area RX. A plurality of fin-type active regions FA may extend parallel to each other in a first horizontal direction (X direction).

In the device area RX, a device isolation film 114 may be arranged in a region between the plurality of fin-type active regions FA. The device isolation film 114 may cover or overlap both sidewalls of each of the plurality of fin-type active regions FA. The plurality of fin-type active regions FA may protrude, in a fin shape, upward from the device isolation film 114. The device isolation film 114 may include an oxide film, a nitride film, or a combination thereof.

A fin isolation insulator 190 may be arranged in the device area RX. In the device area RX, the plurality of fin-type active regions FA may include a plurality of pairs of fin-type active regions FA, which are spaced apart from each other with the fin isolation insulator 190 therebetween and arranged in a straight line in the first horizontal direction (X direction). The fin isolation insulator 190 may extend lengthwise in a second horizontal direction (Y direction) between the plurality of pairs of fin-type active regions FA, the second horizontal direction (Y direction) intersecting with the first horizontal direction (X direction). Herein, one fin-type active region FA of a pair of fin-type active regions FA respectively arranged on both sides of the fin isolation insulator 190, which is between the pair of fin-type active regions FA, may be referred to as a first fin-type active region, and the other of the pair of fin-type active regions FA may be referred to as a second fin-type active region.

A plurality of gate lines 160 may be arranged on the plurality of fin-type active regions FA. The plurality of gate lines 160 may extend lengthwise in the second horizontal direction (Y direction). In areas in which the plurality of fin-type active regions FA intersect with the plurality of gate lines 160, a plurality of nanosheet stacks NSS may be arranged on a fin top surface FT of each of the plurality of fin-type active regions FA. Each of the plurality of nanosheet stacks NSS may include at least one nanosheet spaced apart from the fin top surface FT of the fin-type active region FA in a vertical direction (Z direction) to face the fin top surface FT of the fin-type active region FA.

As shown in FIGS. 2A and 2C, each of the plurality of nanosheet stacks NSS may include a first nanosheet N1, a second nanosheet N2, and a third nanosheet N3, which overlap each other in the vertical direction (Z direction), over the fin-type active region FA. The first nanosheet N1, the second nanosheet N2, and the third nanosheet N3 may respectively have different vertical distances (Z-direction distances) from the fin top surface FT of the fin-type active region FA.

A nanosheet stack NSS may have various planar shapes depending upon respective planar shapes of the fin-type active region FA and a gate line 160. The respective numbers of nanosheet stacks NSS and gate lines 160 arranged over one fin-type active region FA may be variously selected.

Each of the first nanosheet N1, the second nanosheet N2, and the third nanosheet N3, which are included in the nanosheet stack NSS, may function as a channel region. In some embodiments, each of the first nanosheet N1, the second nanosheet N2, and the third nanosheet N3 may have, but are not limited to, a thickness selected from a range of about 4 nm to about 6 nm. Here, the thickness of each of the first nanosheet N1, the second nanosheet N2, and the third nanosheet N3 refers to a size in the vertical direction (Z direction). In some embodiments, the first nanosheet N1, the second nanosheet N2, and the third nanosheet N3 may have substantially the same thickness in the vertical direction (Z direction). In some embodiments, at least some of the first nanosheet N1, the second nanosheet N2, and the third nanosheet N3 may have different thicknesses from each other in the vertical direction (Z direction).

As shown in FIG. 2A, the first nanosheet N1, the second nanosheet N2, and the third nanosheet N3, which are included in one nanosheet stack NSS, may have equal or similar sizes to each other in the first horizontal direction (X direction). In some embodiments, unlike the example shown in FIG. 2A, at least some of the first nanosheet N1, the second nanosheet N2, and the third nanosheet N3, which are included in one nanosheet stack NSS, may have different sizes from each other in the first horizontal direction (X direction).

The plurality of gate lines 160 may be arranged on the fin-type active region FA to surround in the first horizontal direction (X direction) the first nanosheet N1, the second nanosheet N2, and the third nanosheet N3 and extend lengthwise in the second horizontal direction (Y direction).

As shown in FIGS. 2A and 2C, each of the plurality of gate lines 160 may include a main gate portion 160M and a plurality of sub-gate portions 160S. The main gate portion 160M may extend lengthwise in the second horizontal direction (Y direction) to cover or overlap an upper surface of the nanosheet stack NSS. The plurality of sub-gate portions 160S may be integrally connected to the main gate portion 160M and may be respectively arranged one by one between the first nanosheet N1, the second nanosheet N2, and the third nanosheet N3 and between the first nanosheet N1 and the fin-type active region FA. In the vertical direction (Z direction), the thickness of each of the plurality of sub-gate portions 160S may be less than the thickness of the main gate portion 160M.

Each of the plurality of gate lines 160 may include a metal, a metal nitride, a metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may include TiAlC. However, a material constituting the plurality of gate lines 160 is not limited to the examples set forth above.

A gate dielectric film 152 may be arranged between the nanosheet stack NSS and the gate line 160. In some embodiments, the gate dielectric film 152 may include a stack structure of an interface dielectric film and a high-K film. The interface dielectric film may include a low-K material film having a dielectric constant of about 9 or less, for example, a silicon oxide film, a silicon oxynitride film, or a combination thereof. In some embodiments, the interface dielectric film may be omitted. The high-K film may include a material having a dielectric constant that is greater than that of a silicon oxide film. For example, the high-K film may have a dielectric constant of about 10 to about 25. The high-K film may include, but is not limited to, hafnium oxide.

As shown in FIG. 2A, a plurality of recesses R1 may be formed in the fin-type active region FA on both sides of one gate line 160, with the one gate line 160 being between the plurality of recesses R1. A vertical level of a lowermost surface of each of the plurality of recesses R1 may be lower than a vertical level of the fin top surface FT of the fin-type active region FA. As used herein, the term "vertical level" refers to a distance in the vertical direction (Z direction or −Z direction) from the main surface 102M of the substrate 102. A plurality of source/drain regions 130 may be respectively arranged in the plurality of recesses R1.

A pair of source/drain regions 130 may be respectively arranged on the fin-type active region FA on both sides of one gate line 160, with the one gate line 160 being between the pair of source/drain regions 130. The plurality of source/drain regions 130 may be arranged on the fin-type active region FA on both sides of the nanosheet stack NSS. A source/drain region 130 may contact a sidewall of the nanosheet stack NSS surrounded by the gate line 160 that is adjacent to the source/drain region 130. The source/drain region 130 may contact a sidewall of each of the first nanosheet N1, the second nanosheet N2, and the third nanosheet N3, which are included in the nanosheet stack NSS.

Both sidewalls of each of the plurality of gate lines 160 may be covered by or overlapped by an outer insulating spacer 118. The outer insulating spacer 118 may cover or overlap both sidewalls of the main gate portion 160M on an upper surface of each of the plurality of nanosheet stacks NSS. The outer insulating spacer 118 may be spaced apart from the gate line 160 with the gate dielectric film 152 therebetween. The outer insulating spacer 118 may include silicon nitride, silicon oxide, SiCN, SiBN, SiON, SiOCN, SiBCN, SiOC, or a combination thereof. As used herein, each of the terms "SiCN", "SiBN", "SiON", "SiOCN", "SiBCN", and "SiOC" refers to a material including elements contained in each term and is not a chemical formula representing a stoichiometric relationship.

Either sidewall of each of the plurality of sub-gate portions 160S may be spaced apart from the source/drain region 130 with the gate dielectric film 152 therebetween. The gate dielectric film 152 may be arranged between a sub-gate portion 160S of the gate line 160 and each of the first nanosheet N1, the second nanosheet N2, and the third nanosheet N3 and between the sub-gate portion 160S of the gate line 160 and the source/drain region 130.

In some embodiments, the transistor TR formed in the device area RX may include a PMOS transistor, and each of the plurality of source/drain regions 130 may include a plurality of SiGe layers that are epitaxially grown. For example, each of the plurality of source/drain regions 130 may include a $Si_{1-x}Ge_x$ layer (where $x \neq 0$) doped with a p-type dopant and may have an increasing atomic ratio of the element Ge away from the lowermost surface of the recess R1 in the vertical direction (Z direction). The p-type dopant may include, but is not limited to, boron (B), gallium (Ga), or a combination thereof. In some embodiments, each of the plurality of source/drain regions 130 may include, but is not limited to, a $Si_{1-x}Ge_x$ layer (where $0.01 \leq x \leq 0.70$) doped with a p-type dopant.

In some embodiments, the transistor TR formed in the device area RX may include an NMOS transistor, and the plurality of source/drain regions 130 may each include an epitaxially grown Si layer or an epitaxially grown SiC layer. For example, each of the plurality of source/drain regions 130 may include an Si layer doped with an n-type dopant, and the n-type dopant may include phosphorus (P), but the inventive concept is not limited thereto.

As shown in FIGS. 1 and 2A, a plurality of field-effect transistors TR may be formed in areas, in which the plurality of fin-type active regions FA intersect with the plurality of gate lines 160, on the substrate 102. The plurality of field-effect transistors TR may constitute a logic circuit or a memory device.

As shown in FIGS. 2A and 2B, an upper surface of each of the gate dielectric film 152, the gate line 160, and the outer insulating spacer 118 may be covered or overlapped by a capping insulating pattern 164. The capping insulating pattern 164 may include a silicon nitride film.

A plurality of outer insulating spacers 118 and the plurality of source/drain regions 130 on the substrate 102 may be covered by or overlapped by an insulating liner 142. The insulating liner 142 may include silicon nitride (SiN), silicon oxide (SiO), SiCN, SiBN, SiON, SiOCN, SiBCN, SiOC, or a combination thereof. In some embodiments, the insulating liner 142 may be omitted. An inter-gate dielectric 144 may be arranged on the insulating liner 142. The inter-gate dielectric 144 may include a silicon nitride film, a silicon oxide film, SiON, SiOCN, or a combination thereof. When the insulating liner 142 is omitted, the inter-gate dielectric 144 may contact the plurality of source/drain regions 130.

As shown in FIG. 1, the fin isolation insulator 190 may extend lengthwise in the second horizontal direction (Y direction) in the device area RX. The fin isolation insulator 190 may have a planar structure having a line shape that extends together with and parallel to the plurality of gate lines 160 in the second horizontal direction (Y direction). As shown in FIGS. 2A and 2B, the fin isolation insulator 190 may include a lower isolation portion 190L, which passes through a portion of the substrate 102 in the vertical direction (Z direction), and an upper isolation portion 190U passing through or penetrating the inter-gate dielectric 144 and the insulating liner 142 in the vertical direction (Z direction).

The fin isolation insulator 190 may be arranged between a pair of source/drain regions 130, which are respectively arranged on a pair of fin-type active regions FA arranged in a straight line in the first horizontal direction (X direction). One source/drain region 130 may be arranged between the fin isolation insulator 190 and one gate line 160 adjacent to the fin isolation insulator 190.

The fin isolation insulator 190 may include a first nitrogen-rich barrier film 192, a first isolation insulating film 194, a second nitrogen-rich barrier film 196, and a second isolation insulating film 198, which are sequentially arranged in the stated order in the first horizontal direction (X direction) from an outermost portion of the fin isolation insulator 190 toward a central portion of the fin isolation insulator 190.

The first nitrogen-rich barrier film 192 may have at least one protrusion 192P in a first local region thereof facing the source/drain region 130 that is adjacent to the fin isolation insulator 190. The first local region may be a region of the first nitrogen-rich barrier film 192, the region corresponding to a first vertical level LV1 (see FIG. 2B) that is higher than the fin top surface FT of the fin-type active region FA. Although FIGS. 2A and 2B illustrate a configuration in which the first nitrogen-rich barrier film 192 has a plurality of protrusions 192P facing the source/drain region 130, the inventive concept is not limited to the example shown in FIGS. 2A and 2B.

The second nitrogen-rich barrier film 196 may be arranged in a space, which is defined by the first nitrogen-rich barrier film 192, to be spaced apart from the first nitrogen-rich barrier film 192 with the first isolation insulating film 194 therebetween.

The second nitrogen-rich barrier film 196 may include a second local region facing the first local region of the first nitrogen-rich barrier film 192 at the first vertical level LV1. In some embodiments, the second local region of the second nitrogen-rich barrier film 196 may have a smooth surface extending flat in the vertical direction (Z direction) without a protrusion or an uneven portion. In some embodiments, the second local region of the second nitrogen-rich barrier film 196 may include a protrusion at the first vertical level LV1. However, the protrusion of the second nitrogen-rich barrier film 196 may have a smaller size than the protrusion 192P of the first nitrogen-rich barrier film 192. At the first vertical level LV1, surface roughness of the second nitrogen-rich barrier film 196 may be less than surface roughness of the first nitrogen-rich barrier film 192. As used herein, the term "surface roughness" refers to a degree of roughness or unevenness of a surface. For example, surface roughness may refer to the amount and/or degree of protrusions on the surface.

Each of the first nitrogen-rich barrier film 192 and the second nitrogen-rich barrier film 196 may include a nitrogen-doped silicon oxide film, a nitrogen-rich silicon nitride film, a nitrogen-doped silicon film, or a combination thereof. In some embodiments, the first nitrogen-rich barrier film 192 may include a portion contacting the substrate 102, a portion contacting a nanosheet piece PN, a portion contacting a dielectric film piece P152, a portion contacting the outer insulating spacer 118, and a portion contacting the capping insulating pattern 164. In the first nitrogen-rich barrier film 192, each of the portion contacting the substrate 102 and the portion contacting the nanosheet piece PN may include a nitrogen-doped silicon film. In the first nitrogen-rich barrier film 192, the portion contacting the dielectric film piece P152 may include a nitrogen-containing high-K film. For example, the portion contacting the dielectric film piece P152, in the first nitrogen-rich barrier film 192, may include, but is not limited to, a nitrogen-containing hafnium oxide film. The portion contacting the outer insulating spacer 118, in the first nitrogen-rich barrier film 192, may include a nitrogen-doped silicon oxide film, a nitrogen-rich silicon nitride film, or a combination thereof. The portion contacting the capping insulating pattern 164, in the first nitrogen-rich barrier film 192, may include a nitrogen-rich silicon nitride film, a nitrogen-doped silicon oxide film, or a combination thereof.

An outer sidewall of the second nitrogen-rich barrier film 196 may contact the first isolation insulating film 194, and an inner sidewall of the second nitrogen-rich barrier film 196 may contact the second isolation insulating film 198. In some embodiments, the second nitrogen-rich barrier film 196 may include a nitrogen-rich silicon nitride film, a nitrogen-doped silicon oxide film, or a combination thereof. For example, the second nitrogen-rich barrier film 196 may include a nitrogen-rich silicon nitride film. Herein, the nitrogen-doped silicon oxide film refers to an $SiO_2$ film containing nitrogen atoms, the nitrogen-rich silicon nitride film refers to a silicon nitride film including nitrogen atoms in an atomic ratio that is greater than an atomic ratio of nitrogen atoms in an $Si_3N_4$ film, and the nitrogen-doped silicon film refers to a film in which nitrogen atoms are additionally contained in an undoped Si film or in an Si film doped with a p-type dopant and/or an n-type dopant.

In some embodiments, in each of the first nitrogen-rich barrier film 192 and the second nitrogen-rich barrier film 196, the amount of nitrogen may be selected from a range of about 30 at % to about 80 at %, but the inventive concept is not limited thereto. In some embodiments, the amount of nitrogen in some regions of the first nitrogen-rich barrier film 192 may be lower than the amount of nitrogen in the second nitrogen-rich barrier film 196. For example, the amount of nitrogen in some regions of the first nitrogen-rich barrier film 192 may be selected from a range of about 30 at % to about 40 at %, and the amount of nitrogen in the second nitrogen-rich barrier film 196 may be selected from a range of about 30 at % to about 80 at %, but the inventive concept is not limited thereto.

The first isolation insulating film 194 may be surrounded by the first nitrogen-rich barrier film 192 and arranged between the first nitrogen-rich barrier film 192 and the second nitrogen-rich barrier film 196. The second isolation insulating film 198 may be surrounded by the second nitrogen-rich barrier film 196 and spaced apart from the first isolation insulating film 194 with the second nitrogen-rich barrier film 196 therebetween. In some embodiments, each of the first isolation insulating film 194 and the second isolation insulating film 198 may include a silicon nitride film, a silicon oxide film, or a combination thereof. For example, each of the first isolation insulating film 194 and the second isolation insulating film 198 may include a stoichiometrically stable $Si_3N_4$ film or a silicon nitride film in which an atomic ratio of silicon atoms to nitrogen atoms is about 3:4. For example, each of the first isolation insulating film 194 and the second isolation insulating film 198 may include a silicon nitride film in which a bonding ratio of silicon atoms to nitrogen atoms is about 0.75 or less. In this case, the second nitrogen-rich barrier film 196 may include a nitrogen-rich silicon nitride film in which a bonding ratio of silicon atoms to nitrogen atoms is greater than about 0.75. For example, the second nitrogen-rich barrier film 196 may include an $Si_xN_y$ film (where y is a natural number greater than 4 when x is 3, or x is a natural number less than 3 when y is 4).

The first isolation insulating film 194 may include at least one protrusion 194P, which is formed in a region corresponding to the protrusion 192P of the first nitrogen-rich barrier film 192 at the first vertical level LV1 (see FIG. 2B) and faces the source/drain region 130. Although FIGS. 2A and 2B illustrate a configuration in which the first isolation insulating film 194 has a plurality of protrusions 194P facing the source/drain region 130, the inventive concept is not limited to the example shown in FIGS. 2A and 2B.

As shown in FIGS. 2A and 2B, in the fin isolation insulator 190, each of the first nitrogen-rich barrier film 192, the first isolation insulating film 194, and the second nitrogen-rich barrier film 196 may have a U-like or U-shaped cross-sectional shape. All portions of each of the first isolation insulating film 194, the second nitrogen-rich barrier film 196, and the second isolation insulating film 198 may be arranged in a space defined by the first nitrogen-rich barrier film 192, that is, in an inner space of the first nitrogen-rich barrier film 192. All portions of each of the second nitrogen-rich barrier film 196 and the second isolation insulating film 198 may be arranged in a space defined by the first isolation insulating film 194, that is, in an inner space of the first isolation insulating film 194. All portions of the second isolation insulating film 198 may be arranged in a space defined by the second nitrogen-rich barrier film 196, that is, in an inner space of the second nitrogen-rich barrier film 196. The second isolation insulating film 198 may have a plug shape having an inside filled with an insulating material.

In the fin isolation insulator 190, an uppermost surface of each of the first nitrogen-rich barrier film 192, the first isolation insulating film 194, the second nitrogen-rich barrier film 196, and the second isolation insulating film 198 may be on the same plane (X-Y plane in FIGS. 2A and 2B) at the same vertical level. Respective lowermost surfaces of the first nitrogen-rich barrier film 192, the first isolation insulating film 194, the second nitrogen-rich barrier film 196, and the second isolation insulating film 198 may be at different vertical levels from each other. As shown in FIGS. 2A and 2C, the vertical level of the lowermost surface of the first nitrogen-rich barrier film 192 may be lower than the vertical level of the lowermost surface of the first isolation insulating film 194, the vertical level of the lowermost surface of the first isolation insulating film 194 may be lower than the vertical level of the lowermost surface of the second nitrogen-rich barrier film 196, and the vertical level of the lowermost surface of the second nitrogen-rich barrier film 196 may be lower than the vertical level of the lowermost surface of the second isolation insulating film 198.

As shown in FIGS. 2A and 2B, the lower isolation portion 190L of the fin isolation insulator 190 may pass through a portion of the substrate 102 at a second vertical level LV2, which is lower than the first vertical level LV1, and extend lengthwise in the vertical direction (Z direction). In addition, the upper isolation portion 190U of the fin isolation insulator 190 may extend lengthwise away from the substrate 102 in the vertical direction (Z direction) at a vertical level that is higher than the vertical level of the fin top surface FT of each of the plurality of fin-type active regions FA. A vertical level of a lowermost portion of the fin isolation insulator 190, that is, a vertical level of a lowermost portion of the lower isolation portion 190L, may be lower than a vertical level of a lowermost portion of the source/drain region 130. The upper isolation portion 190U of the fin isolation insulator 190 may be arranged between a pair of gate lines 160 adjacent to each other on both sides of the fin isolation insulator 190. In the first horizontal direction (X direction), the width of the lower isolation portion 190L may be less than those of other portions of the fin isolation insulator 190. For example, in the first horizontal direction (X direction), the lower isolation portion 190L may have a width that is less than that of the upper isolation portion 190U.

In the lower isolation portion 190L of the fin isolation insulator 190, the first nitrogen-rich barrier film 192 and the second nitrogen-rich barrier film 196 may include different materials from each other, and the first isolation insulating film 194 and the second isolation insulating film 198 may include the same material.

For example, in the lower isolation portion 190L of the fin isolation insulator 190, the first nitrogen-rich barrier film 192 may contact the substrate 102 and may include a nitrogen-doped silicon film including nitrogen in an amount selected from a range of about 30 at % to about 40 at %. In the lower isolation portion 190L of the fin isolation insulator 190, the second nitrogen-rich barrier film 196 may be arranged between the first isolation insulating film 194 and the second isolation insulating film 198 and may include a nitrogen-rich silicon nitride film including nitrogen in an amount selected from a range of about 60 at % to about 80 at %. However, the inventive concept is not limited to the examples set forth above. In the lower isolation portion 190L of the fin isolation insulator 190, each of the first isolation insulating film 194 and the second isolation insulating film 198 may include a silicon nitride film in which a bonding ratio of silicon atoms to nitrogen atoms is about 0.75 or less.

As shown in FIG. 1, the plurality of gate lines 160 may include a plurality of dummy gate lines DG. Each of the plurality of dummy gate lines DG may be arranged in a straight line with the fin isolation insulator 190 in the second horizontal direction (Y direction) and extend in the second horizontal direction (Y direction) from one end of the fin isolation insulator 190. Each of the plurality of dummy gate lines DG may have the same cross-sectional structure as that of the gate line 160, for example, the gate line 160 shown in FIG. 2, adjacent to the fin isolation insulator 190 in the first horizontal direction (X direction). In the first horizontal direction (X direction), a distance between one gate line 160, which is selected from a pair of gate lines 160 adjacent to each other with the fin isolation insulator 190 therebetween, and a dummy gate line DG arranged in a straight line with the fin isolation insulator 190 may be equal to or similar to a distance between the other gate line 160, which is selected from the pair of gate lines 160, and the dummy gate line DG arranged in a straight line with the fin isolation insulator 190.

As shown in FIGS. 2A and 2B, the integrated circuit device 100 may include a plurality of source/drain contacts 174 respectively arranged on the plurality of source/drain regions 130. Each of the plurality of source/drain contacts 174 may extend lengthwise in the vertical direction (Z direction) on the source/drain region 130 to be away from the substrate 102. A metal silicide film 172 may be arranged between the source/drain region 130 and a source/drain contact 174.

Each of the plurality of source/drain contacts 174 may fill the inside of a contact hole 170H that passes through the inter-gate dielectric 144 and the insulating liner 142 in the vertical direction (Z direction) and extends to the inside of the source/drain region 130. The source/drain region 130 may be spaced apart from the source/drain contact 174 with the metal silicide film 172 therebetween. Each source/drain region 130 may be arranged outside the contact hole 170H to surround a bottom portion of the source/drain contact 174.

In some embodiments, each of the plurality of source/drain contacts 174 may include a metal, a conductive metal nitride, or a combination thereof. For example, each of the plurality of source/drain contacts 174 may include W, Cu, Al, Ti, Ta, TiN, TaN, an alloy thereof, or a combination thereof. In some embodiments, the metal silicide film 172 may include, but is not limited to, titanium silicide. In some embodiments, the metal silicide film 172 may be omitted.

The integrated circuit device 100 described with reference to FIGS. 1 and 2A to 2C includes the fin isolation insulator 190 including a plurality of nitrogen-rich barrier films that are spaced apart from each other. The fin isolation insulator 190 may include the first nitrogen-rich barrier film 192 and the second nitrogen-rich barrier film 196, which are spaced apart from each other, and the first isolation insulating film 194 and the second isolation insulating film 198, which have dense structures without voids, may respectively fill or be in the space between the first nitrogen-rich barrier film 192 and the second nitrogen-rich barrier film 196 and the space defined by the second nitrogen-rich barrier film 196. Therefore, the fin isolation insulator 190, which is arranged in a fin isolation region provided to insulate adjacent transistors from each other, may have a reliable structure including no voids therein. Therefore, the fin isolation region provided by the fin isolation insulator 190 may have a stable structure without structurally vulnerable defects, such as voids. In particular, even when, due to the down-scaling, the area of a device area is reduced and the aspect ratio of the fin isolation region is increased, transistors TR adjacent to each other with the fin isolation insulator 190 therebetween may be stably insulated from each other by the fin isolation insulator 190, and unintended leakage current between the adjacent transistors TR may be suppressed. Therefore, the plurality of transistors TR in the integrated circuit device 100 may provide optimum performance, and the integrated circuit device 100 may have improved reliability.

Figure 3:
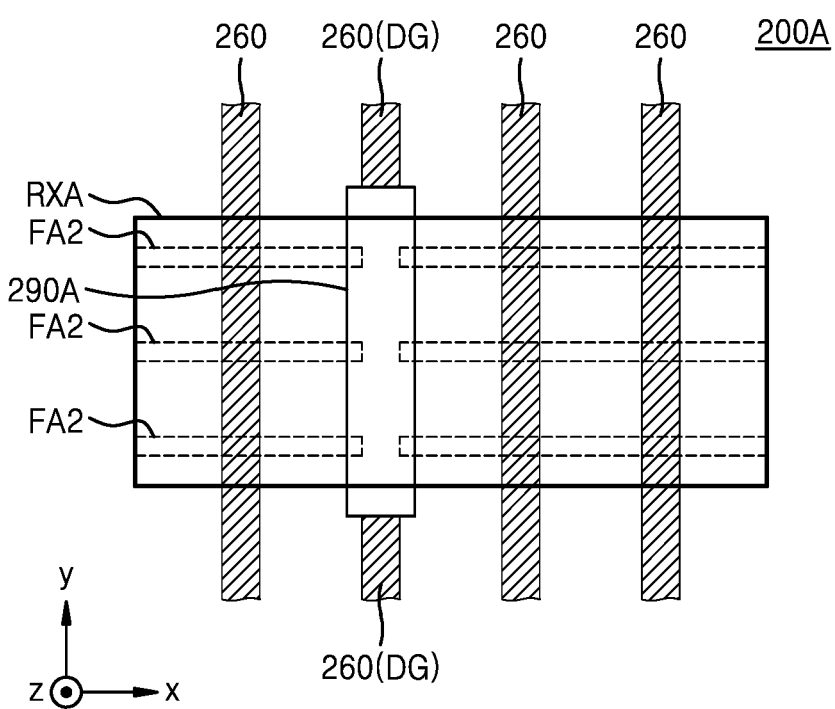
FIG. 3 is a planar layout diagram illustrating an integrated circuit device according to some embodiments.

FIG. 3 is a planar layout diagram illustrating an integrated circuit device 200A according to some embodiments.

Referring to FIG. 3, the integrated circuit device 200A may have substantially the same configuration as the integrated circuit device 100 described with reference to FIGS. 1 and 2A to 2C. However, the integrated circuit device 200A may include a plurality of fin-type active regions FA2 arranged in a device area RXA, and a fin isolation insulator 290A. The plurality of fin-type active regions FA2 may include a plurality of pairs of fin-type active regions FA2, which are spaced apart from each other with the fin isolation insulator 290A therebetween and arranged in a straight line in the first horizontal direction (X direction).

A plurality of gate lines 260 may extend parallel to each other in the second horizontal direction (Y direction) on the plurality of fin-type active regions FA2. One gate line 260 selected from the plurality of gate lines 260 may be arranged between the fin isolation insulator 290A and another gate line 260. The plurality of gate lines 260 may include a plurality of dummy gate lines DG. Each of the plurality of dummy gate lines DG may be arranged in a straight line with the fin isolation insulator 290A in the second horizontal direction (Y direction) and extend in the second horizontal direction (Y direction) from one end of the fin isolation insulator 290A.

More detailed configurations of the device area RXA, the fin-type active region FA2, the gate line 260, and the fin isolation insulator 290A are substantially the same as described regarding the device area RX, the fin-type active region FA, the gate line 160, and the fin isolation insulator 190 with reference to FIGS. 1 and 2A to 2C.

Figure 4:
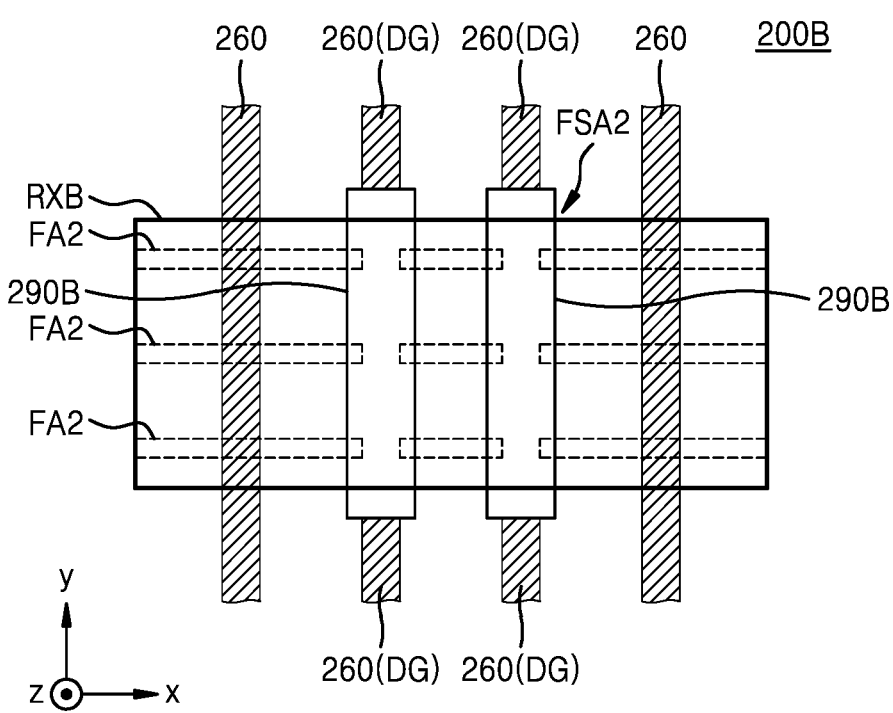
FIG. 4 is a planar layout diagram illustrating an integrated circuit device according to some embodiments.

FIG. 4 is a planar layout diagram illustrating an integrated circuit device 200B according to some embodiments.

Referring to FIG. 4, the integrated circuit device 200B may have substantially the same configuration as the integrated circuit device 200A described with reference to FIG. 3. However, the integrated circuit device 200B may include the plurality of fin-type active regions FA2 arranged in a device area RXB, and a pair of fin isolation insulators 290B. The plurality of fin-type active regions FA2 may include a plurality of pairs of fin-type active regions FA2, which are spaced apart from each other with one fin isolation insulator 290B therebetween and arranged in a straight line in the first horizontal direction (X direction), the one fin isolation insulator 290B being selected from the pair of fin isolation insulators 290B.

In the device area RXB, the plurality of fin-type active regions FA2 may include a plurality of sets of three fin-type active regions FA2 aligned along a straight line extending in the first horizontal direction (X direction). Each pair of fin-type active regions FA2 adjacent to each other, from among each set of three fin-type active regions FA2, may be spaced apart from each other with one fin isolation insulator 290B therebetween. In the device area RXB, each of the pair of fin isolation insulators 290B may extend in the second horizontal direction (Y direction) to pass between two fin-type active regions FA2, which are adjacent to each other and selected from among each set of three fin-type active regions FA2 aligned along the straight line extending in the first horizontal direction (X direction).

More detailed configurations of the device area RXB and the pair of fin isolation insulators 290B are substantially the same as described regarding the device area RX and the fin isolation insulator 190 with reference to FIGS. 1 and 2A to 2C.

Figure 5:
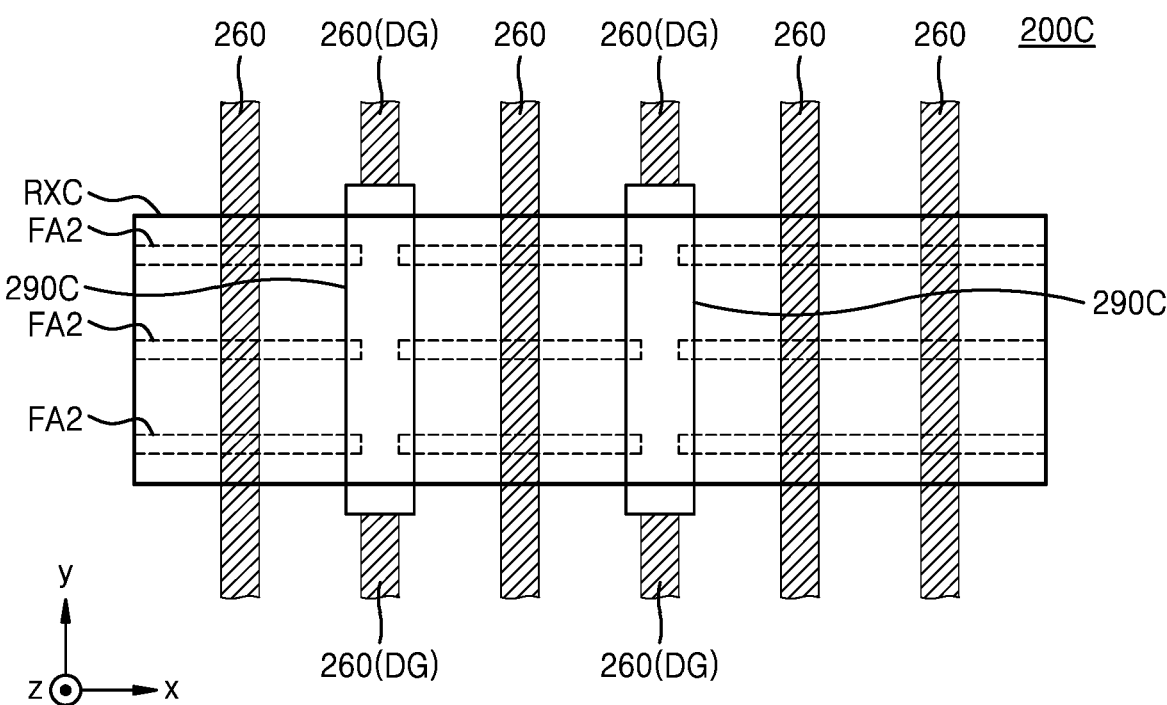
FIG. 5 is a planar layout diagram illustrating an integrated circuit device according to some embodiments.

FIG. 5 is a planar layout diagram illustrating an integrated circuit device 200C according to some embodiments.

Referring to FIG. 5, the integrated circuit device 200C may have substantially the same configuration as the integrated circuit device 200B described with reference to FIG. 4. However, the integrated circuit device 200C may include the plurality of fin-type active regions FA2 arranged in a device area RXC, and a pair of fin isolation insulators 290C. The plurality of fin-type active regions FA2 may include a plurality of pairs of fin-type active regions FA2, which are spaced apart from each other with one fin isolation insulator 290C therebetween and arranged in a straight line in the first horizontal direction (X direction), the one fin isolation insulator 290C being selected from the pair of fin isolation insulators 290C.

In the device area RXC, the plurality of fin-type active regions FA2 may include a plurality of sets of three fin-type active regions FA2 aligned along a straight line extending in the first horizontal direction (X direction). Each pair of fin-type active regions FA2 adjacent to each other, from among each set of three fin-type active regions FA2, may be spaced apart from each other with one fin isolation insulator 290C therebetween. In the device area RXC, each of the pair of fin isolation insulators 290C may extend lengthwise in the second horizontal direction (Y direction) to pass between two fin-type active regions FA2, which are adjacent to each other and selected from among each set of three fin-type active regions FA2 aligned along the straight line extending in the first horizontal direction (X direction).

The plurality of gate lines 260 in the integrated circuit device 200C may include one gate line 260 arranged on a fin-type active region FA2, which is between the pair of fin isolation insulators 290C and selected from among each set of three fin-type active regions FA2 aligned along the straight line extending in the first horizontal direction (X direction). The one gate line 260 may extend lengthwise in the second horizontal direction (Y direction) between the pair of fin isolation insulators 290C.

More detailed configurations of the device area RXC and the pair of fin isolation insulators 290C are substantially the same as described regarding the device area RX and the fin isolation insulator 190 with reference to FIGS. 1 and 2A to 2C.

FIGS. 6A to 6M are cross-sectional views respectively illustrating a sequence of processes of a method of fabricating an integrated circuit device, according to some embodiments. FIGS. 6A to 6M illustrate cross-sectional configurations of regions corresponding to a cross-section taken along the line X1-X1' of FIG. 1, according to the sequence of processes, respectively. A method of fabricating the integrated circuit device 100 shown in FIGS. 1 and 2A to 2C is described with reference to FIGS. 6A to 6M. In FIGS. 6A to 6M, the same reference numerals as in FIGS. 2A to 2C respectively denote the same members, and here, repeated descriptions thereof are omitted.

Figure 6A:
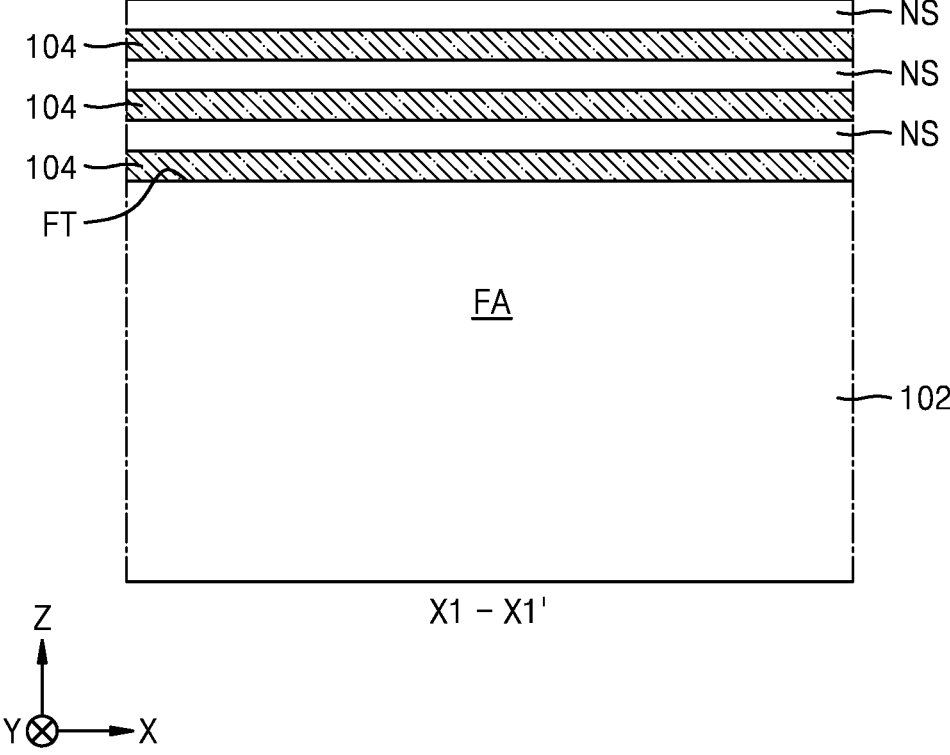
FIGS. 6A to 6M are cross-sectional views respectively illustrating a sequence of processes of a method of fabricating an integrated circuit device, according to some embodiments.

Referring to FIG. 6A, a plurality of sacrificial semiconductor layers 104 and a plurality of nanosheet semiconductor layers NS may be alternately stacked one by one on the substrate 102, and then, the plurality of sacrificial semiconductor layers 104, the plurality of nanosheet semiconductor layers NS, and the substrate 102 may be partially etched, thereby defining the fin-type active region FA in the substrate 102. Next, the device isolation film 114 (see FIG. 2C) may be formed to cover the sidewall of the fin-type active region FA. A stack structure of the plurality of sacrificial semiconductor layers 104 and the plurality of nanosheet semiconductor layers NS may remain on the fin top surface FT of the fin-type active region FA.

The plurality of sacrificial semiconductor layers 104 and the plurality of nanosheet semiconductor layers NS may respectively include semiconductor materials having different etch selectivities from each other. In some embodiments, the plurality of nanosheet semiconductor layers NS may each include an Si layer, and the plurality of sacrificial semiconductor layers 104 may each include an SiGe layer. In some embodiments, the amount of Ge may be constant in the plurality of sacrificial semiconductor layers 104. The SiGe layer constituting the plurality of sacrificial semiconductor layers 104 may include Ge in a constant amount selected from a range of about 5 at % to about 60 at %, for example, about 10 at % to about 40 at %. The amount of Ge in the SiGe layer, which constitutes the plurality of sacrificial semiconductor layers 104, may be variously selected as needed.

Figure 6B:
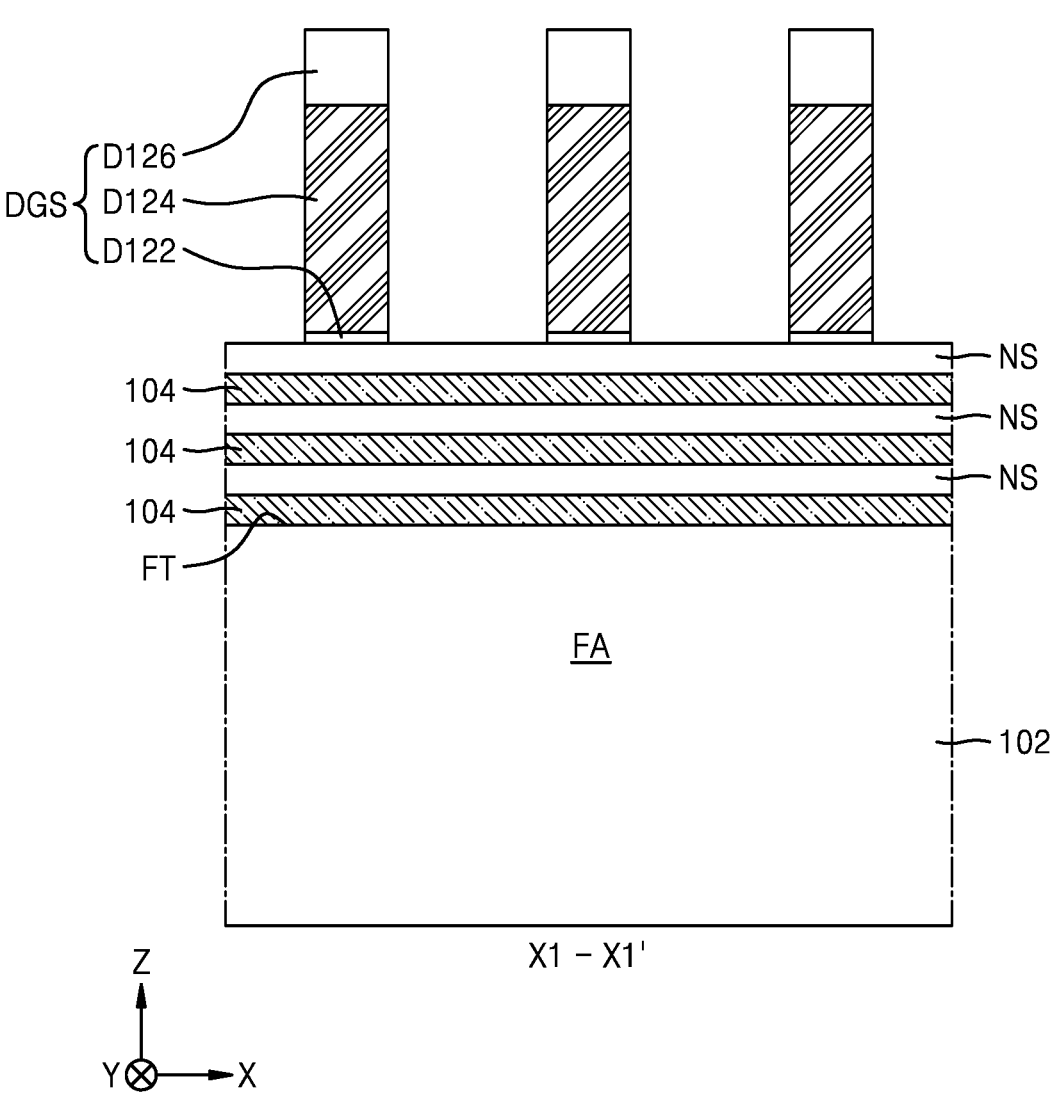

Referring to FIG. 6B, a plurality of dummy gate structures DGS may be formed on the stack structure of the plurality of sacrificial semiconductor layers 104 and the plurality of nanosheet semiconductor layers NS.

Each of the plurality of dummy gate structures DGS may extend lengthwise in the second horizontal direction (Y direction). Each of the plurality of dummy gate structures DGS may have a structure in which an oxide film D122, a dummy gate layer D124, and a capping layer D126 are stacked in the stated order. In some embodiments, the dummy gate layer D124 may include polysilicon, and the capping layer D126 may include a silicon nitride film.

Figure 6C:
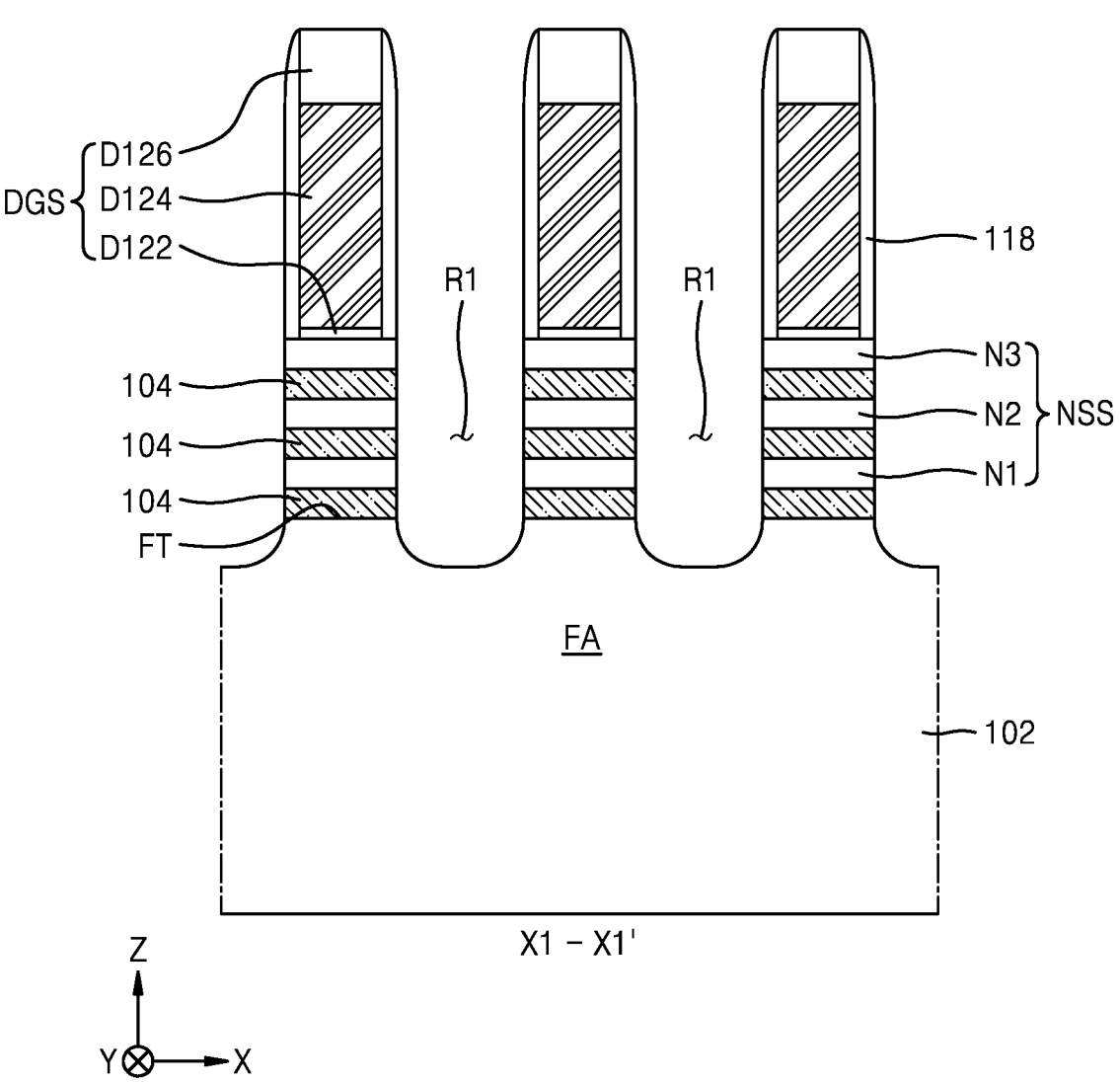

Referring to FIG. 6C, the plurality of outer insulating spacers 118 may be formed to cover both sidewalls of each of the plurality of dummy gate structures DGS, followed by etching a portion of each of the plurality of sacrificial semiconductor layers 104 and the plurality of nanosheet semiconductor layers NS and a portion of the fin-type active region FA by using the plurality of dummy gate structures DGS and the plurality of outer insulating spacers 118 as an etch mask, thereby dividing the plurality of nanosheet semiconductor layers NS into the plurality of nanosheet stacks NSS and forming the plurality of recesses R1 in an upper portion of the fin-type active region FA. Each of the plurality of nanosheet stacks NSS may include the first nanosheet N1, the second nanosheet N2, and the third nanosheet N3. To form the plurality of recesses R1, etching may be performed by using dry etching, wet etching, or a combination thereof.

Figure 6D:
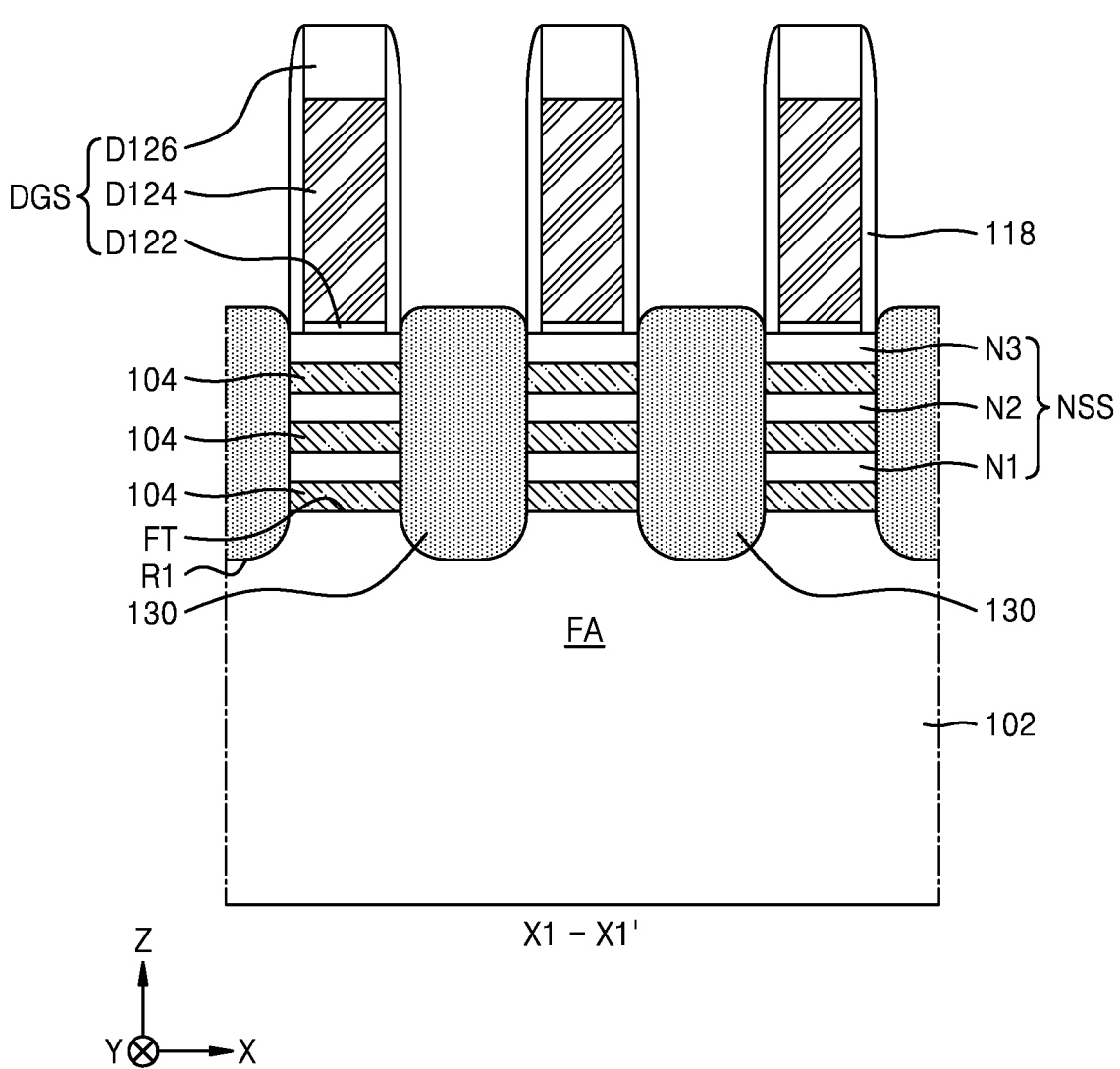

Referring to FIG. 6D, in a resulting product of FIG. 6C, the plurality of source/drain regions 130 may be formed to fill the plurality of recesses R1, respectively.

To form the plurality of source/drain regions 130, a semiconductor material may be epitaxially grown on a surface of the fin-type active region FA, which is exposed at bottom surfaces of the plurality of recesses R1, and on the sidewall of each of the first nanosheet N1, the second nanosheet N2, and the third nanosheet N3, which are included in the nanosheet stack NSS.

Figure 6E:
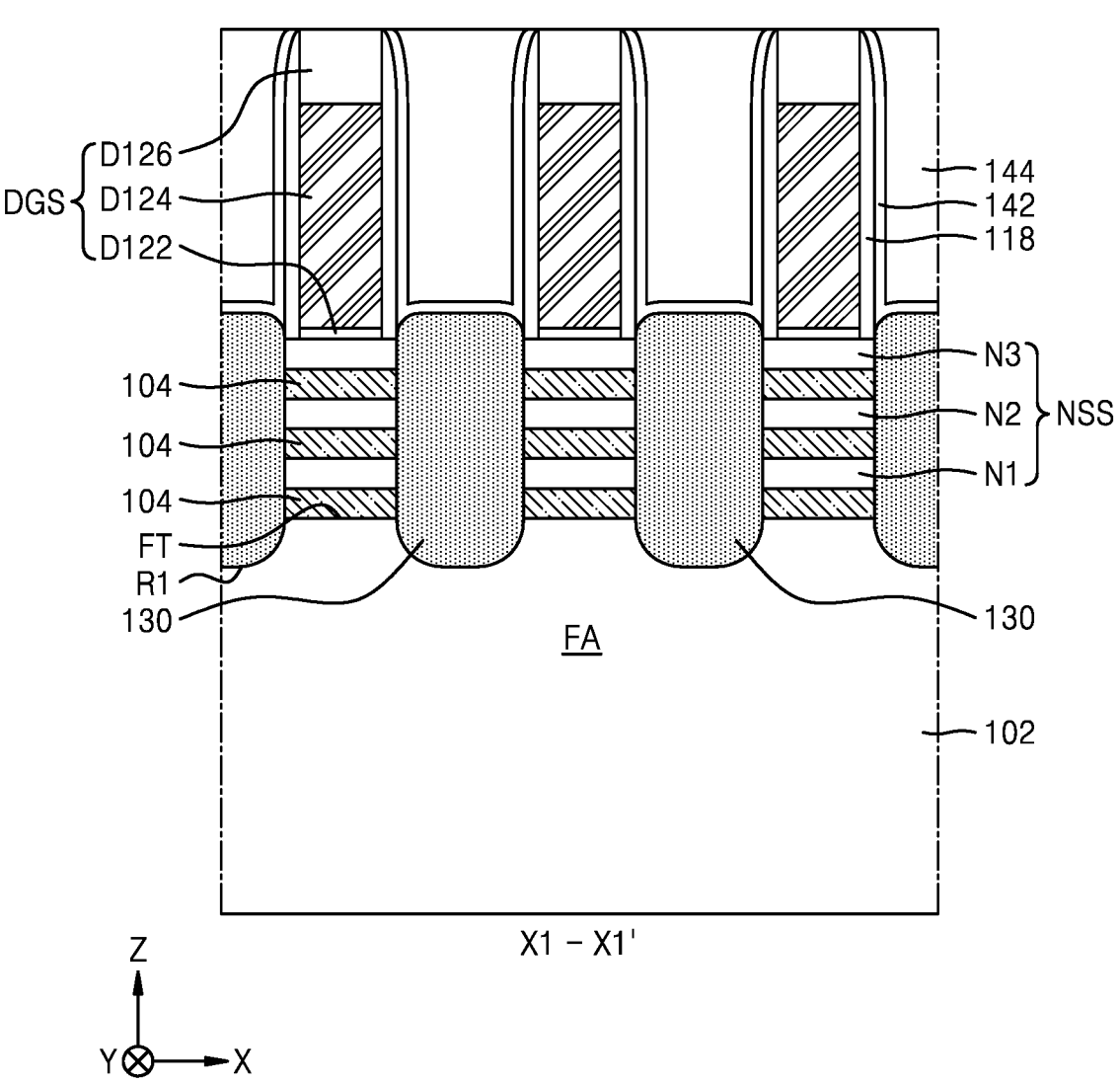

Referring to FIG. 6E, the insulating liner 142 may be formed to cover a resulting product of FIG. 6D, followed by forming the inter-gate dielectric 144 on the insulating liner 142, and then, an upper surface of the capping layer D126 may be exposed by planarizing the insulating liner 142 and the inter-gate dielectric 144.

Figure 6F:
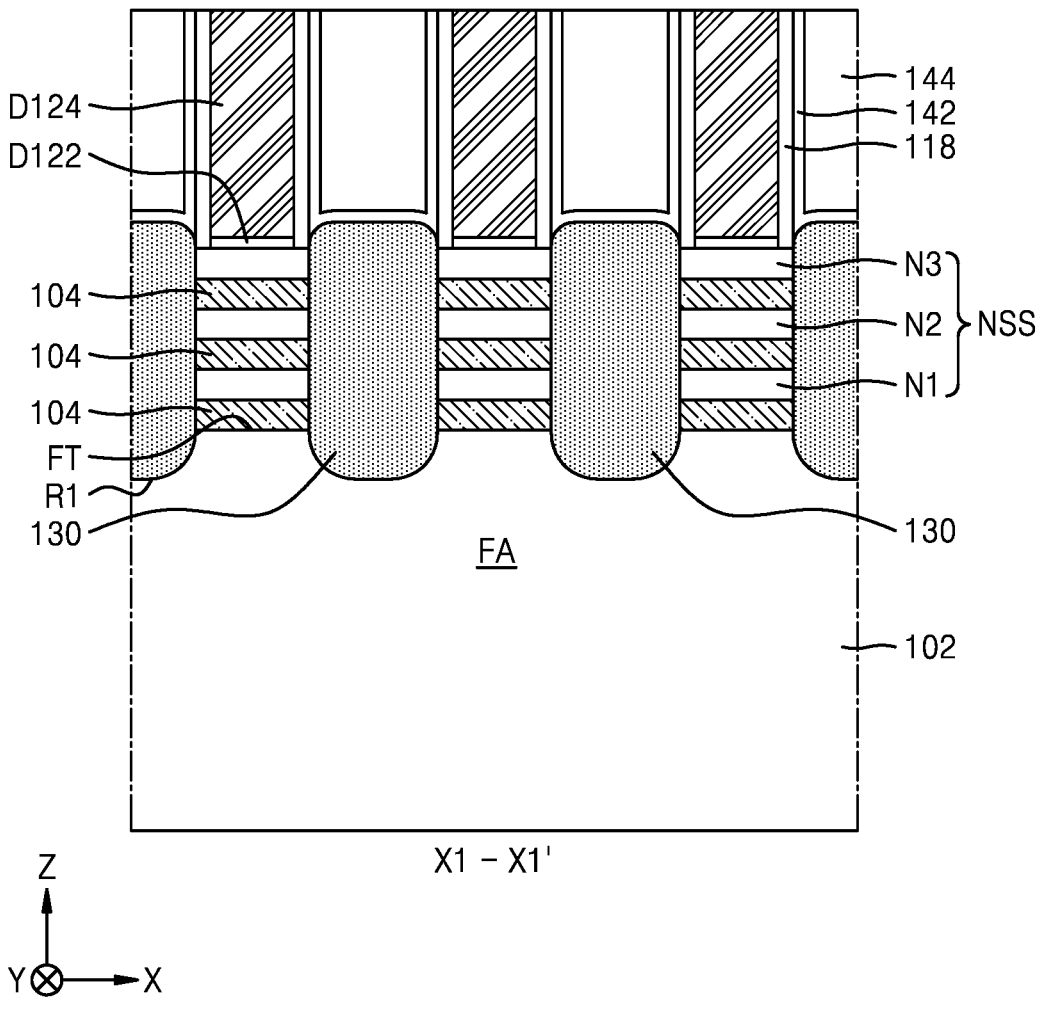

Referring to FIG. 6F, an upper surface of the dummy gate layer D124 may be exposed by removing the capping layer D126 from a resulting product of FIG. 6E, and the insulating liner 142 and the inter-gate dielectric 144 may be partially removed such that the upper surface of the inter-gate dielectric 144 is at a level approximately equal to that of the upper surface of the dummy gate layer D124.

Figure 6G:
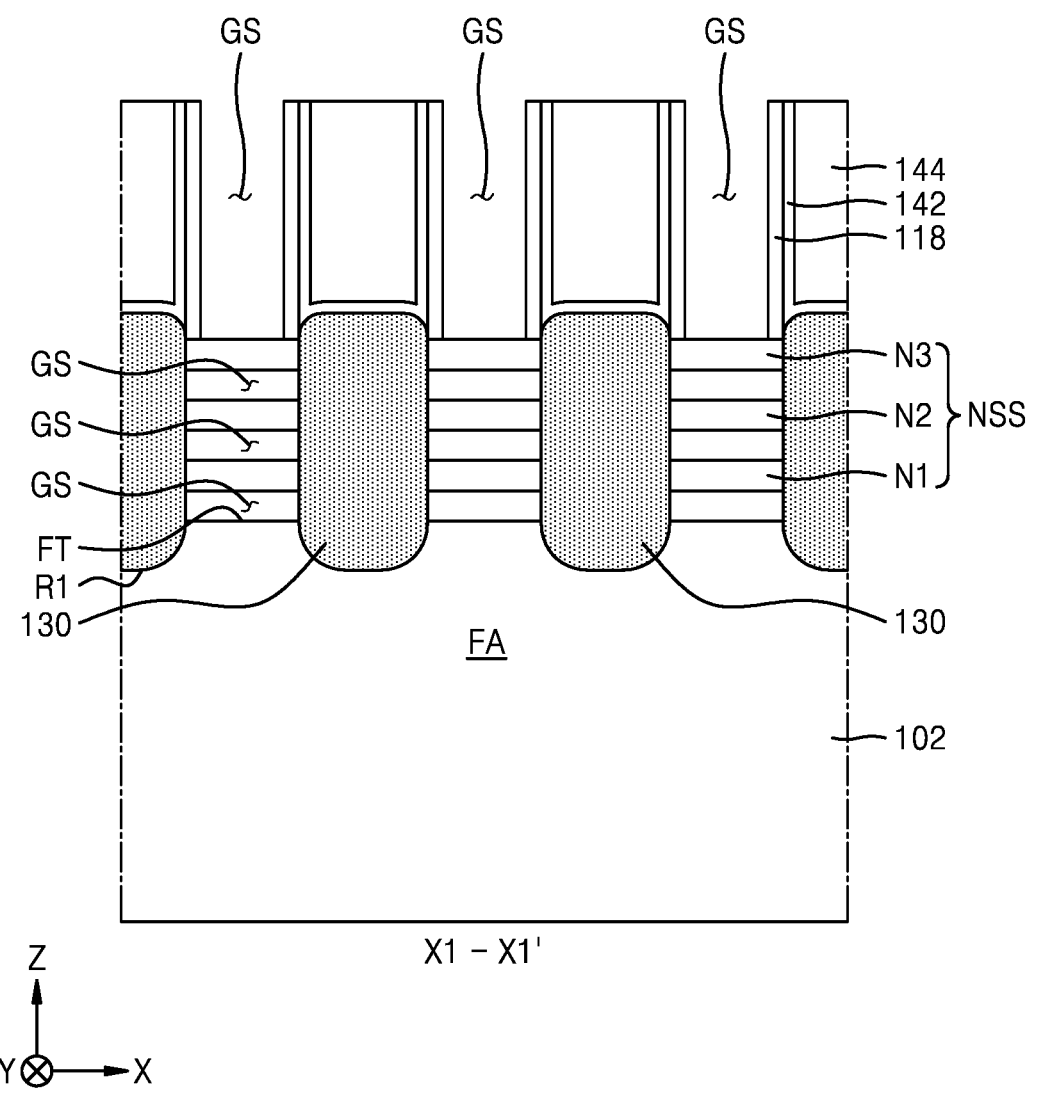

Referring to FIG. 6G, a gate space GS may be provided by removing the dummy gate layer D124 and the oxide film D122 under the dummy gate layer D124 from a resulting product of FIG. 6F, and the plurality of nanosheet stacks NSS may be exposed by the gate space GS. Next, by removing the plurality of sacrificial semiconductor layers 104, which remain over the fin-type active region FA, through the gate space GS, the gate space GS may expand up to spaces between the first nanosheet N1, the second nanosheet N2, and the third nanosheet N3 and a space between the first nanosheet N1 and the fin top surface FT of the fin-type active region FA.

In some embodiments, to selectively remove the plurality of sacrificial semiconductor layers 104, a difference in etch selectivity between the plurality of sacrificial semiconductor layers 104 and each of the first nanosheet N1, the second nanosheet N2, and the third nanosheet N3 may be used.

Figure 6H:
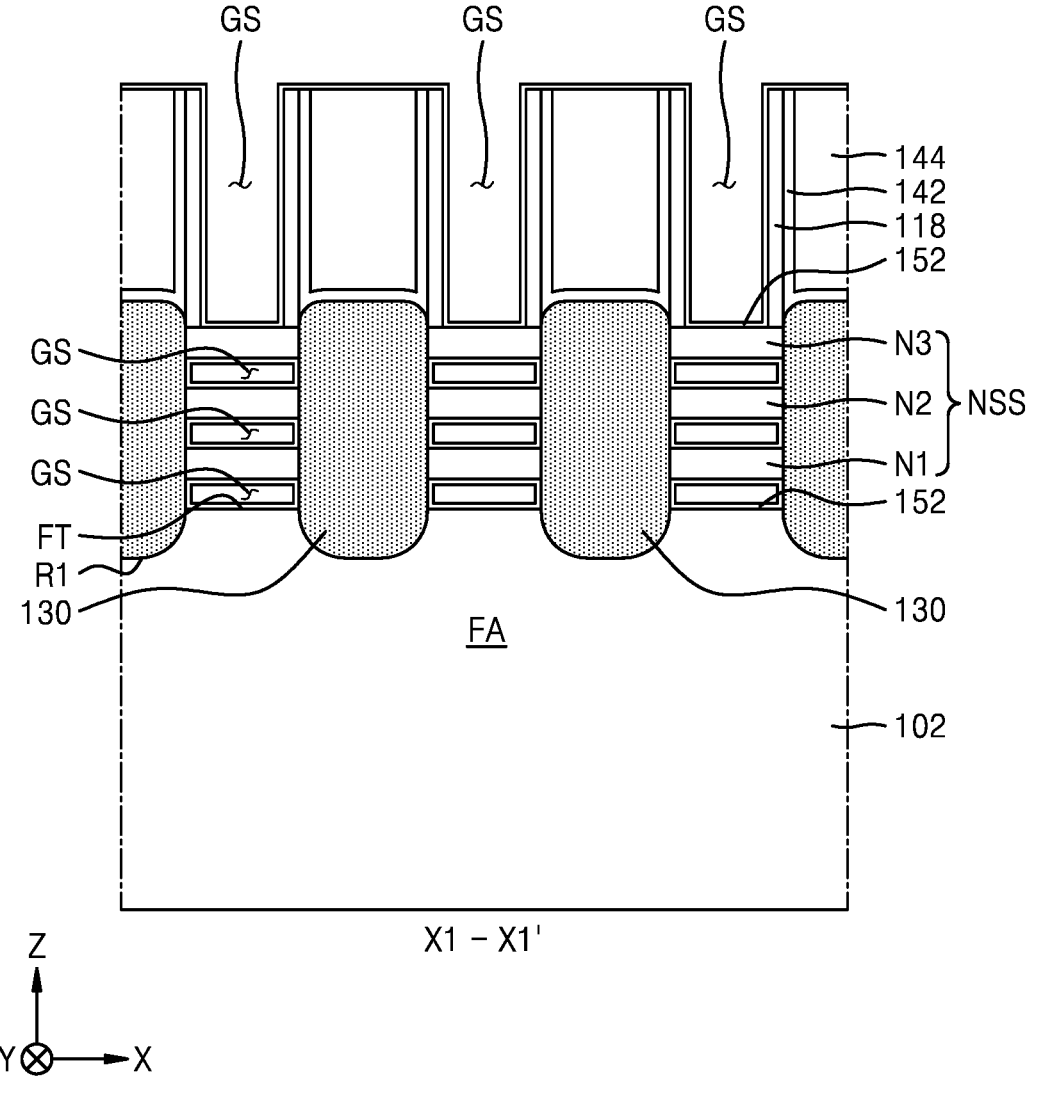

Referring to FIG. 6H, the gate dielectric film 152 may be formed to cover respective exposed surfaces of the first nanosheet N1, the second nanosheet N2, the third nanosheet N3, and the fin-type active region FA. To form the gate dielectric film 152, an atomic layer deposition (ALD) process may be used.

Figure 6I:
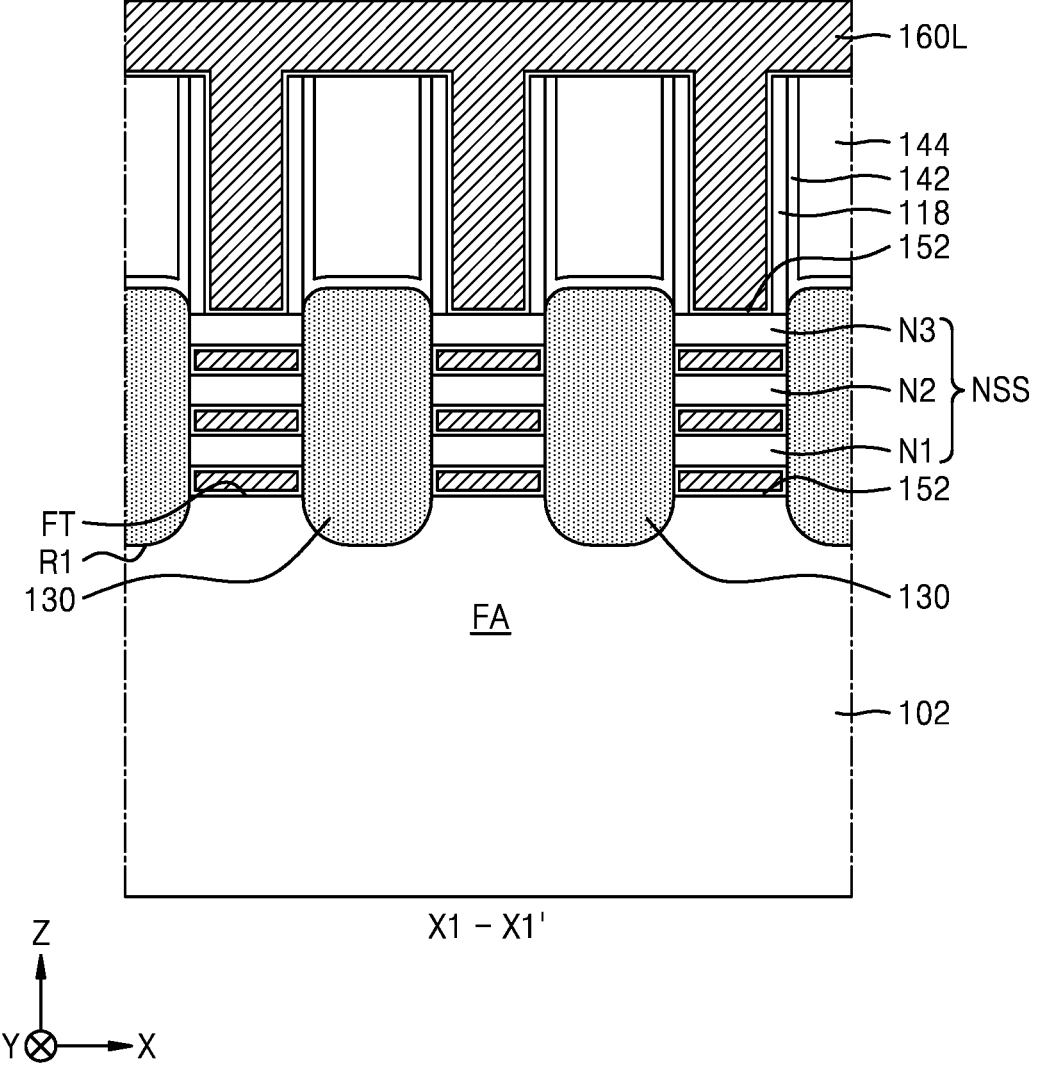

Referring to FIG. 6I, a gate forming conductive layer 160L may be formed on the gate dielectric film 152 to fill the gate space GS (see FIG. 6H) and cover the upper surface of the inter-gate dielectric 144. The gate forming conductive layer 160L may include a metal, a metal nitride, a metal carbide, or a combination thereof. To form the gate forming conductive layer 160L, an ALD process or a chemical vapor deposition (CVD) process may be used.

Figure 6J:
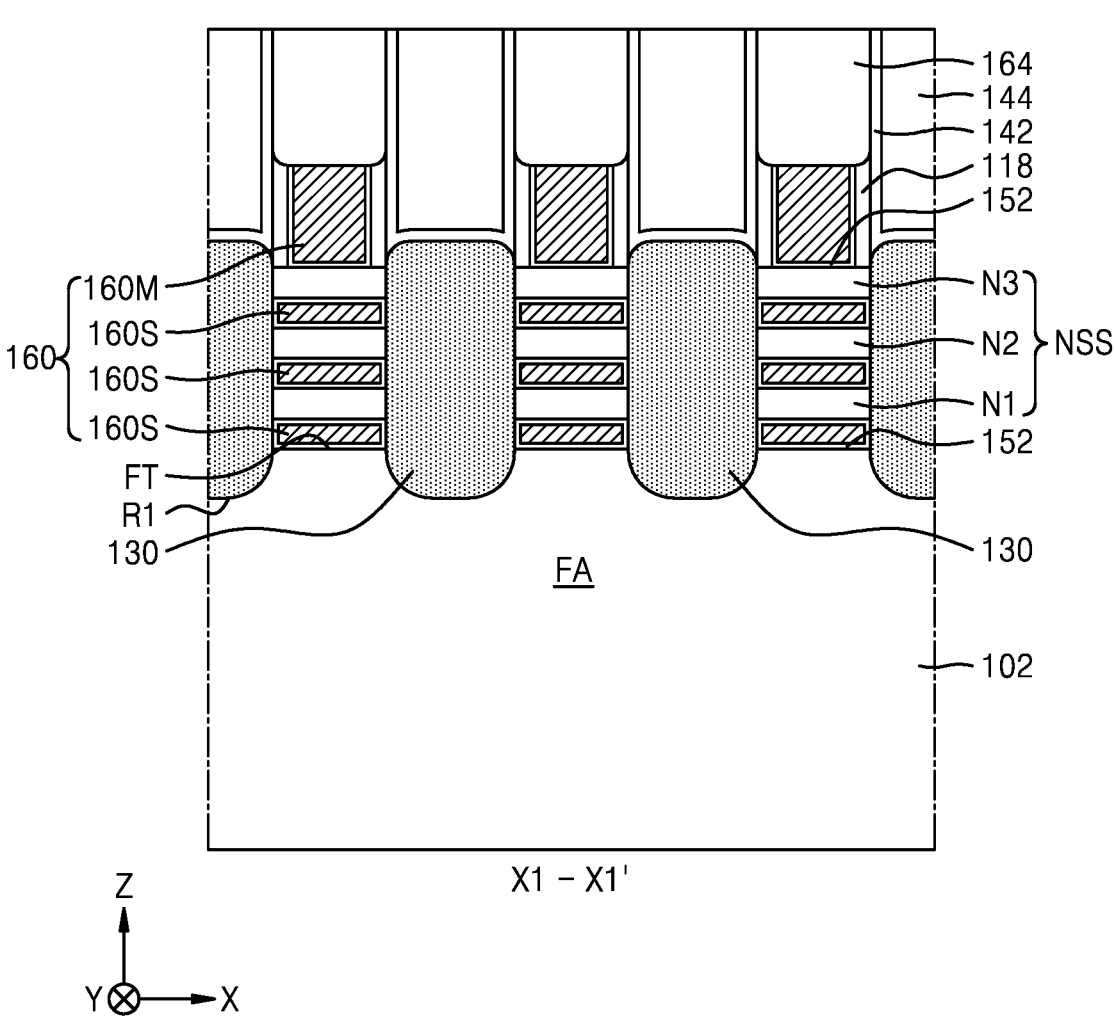

Referring to FIG. 6J, in a resulting product 6I, the gate forming conductive layer 160L and the gate dielectric film 152 may be partially removed from upper surfaces thereof such that the upper surface of the inter-gate dielectric 144 is exposed and an upper portion of the gate space GS is emptied again. Here, the plurality of outer insulating spacers 118 may also be partially removed from respective upper portions thereof, and thus, the height of each of the plurality of outer insulating spacers 118 may be reduced. Next, the capping insulating pattern 164 may be formed on the gate line 160 to fill the gate space GS.

Figure 6K:
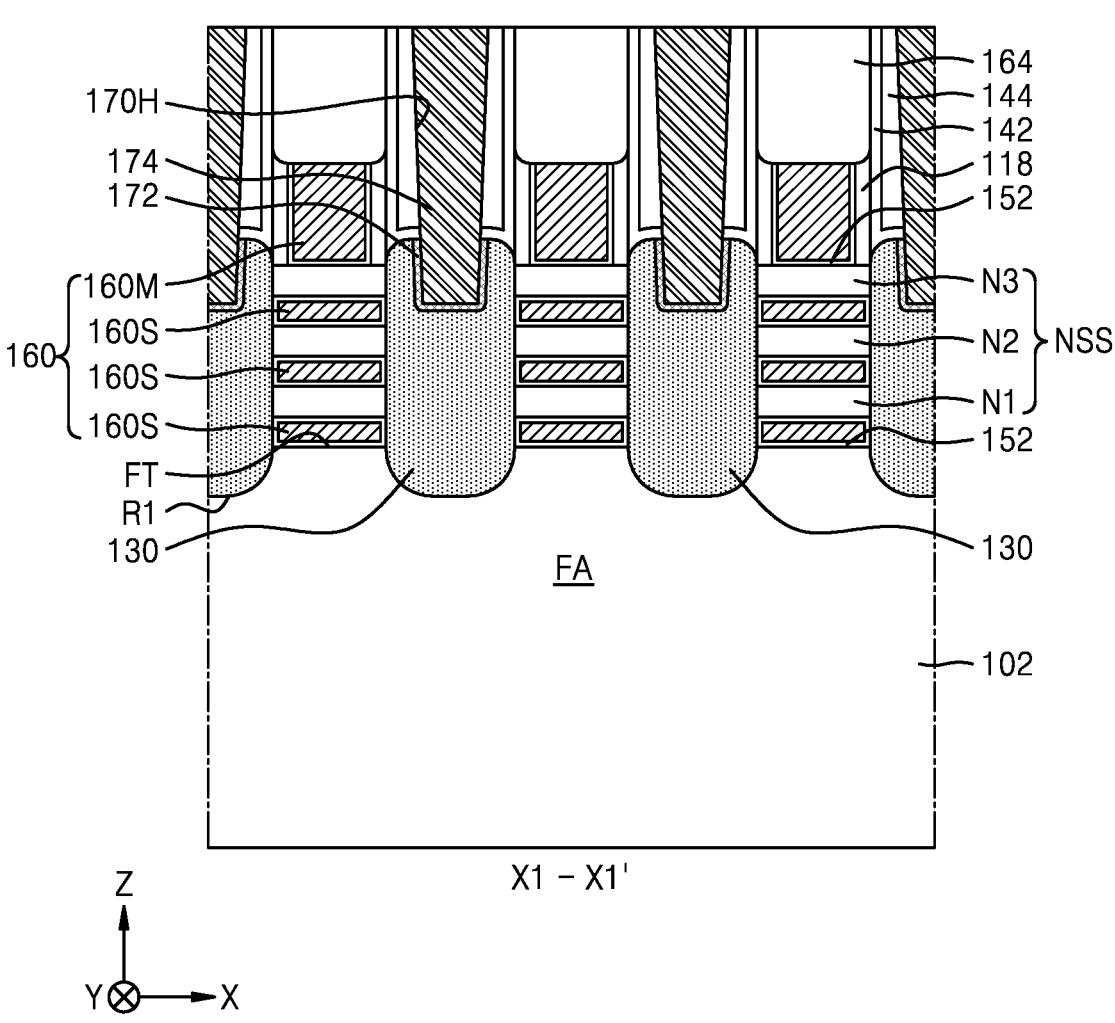

Referring to FIG. 6K, a plurality of contact holes 170H may be formed to pass through the inter-gate dielectric 144 and the insulating liner 142 in the vertical direction (Z direction) and expose the source/drain region 130, followed by forming a plurality of metal silicide films 172 by partially silicidating the plurality of source/drain regions 130 exposed by the plurality of contact holes 170H, and then, the plurality of source/drain contacts 174 may be respectively formed on the plurality of metal silicide films 172 to fill the contact holes 170H.

After the plurality of source/drain contacts 174 are formed, a resulting product, in which respective upper surfaces of structures including the plurality of source/drain contacts 174 and including a plurality of capping insulating patterns 164 and the plurality of outer insulating spacers 118 around the plurality of source/drain contacts 174 are planarized, may be obtained.

Figure 6L:
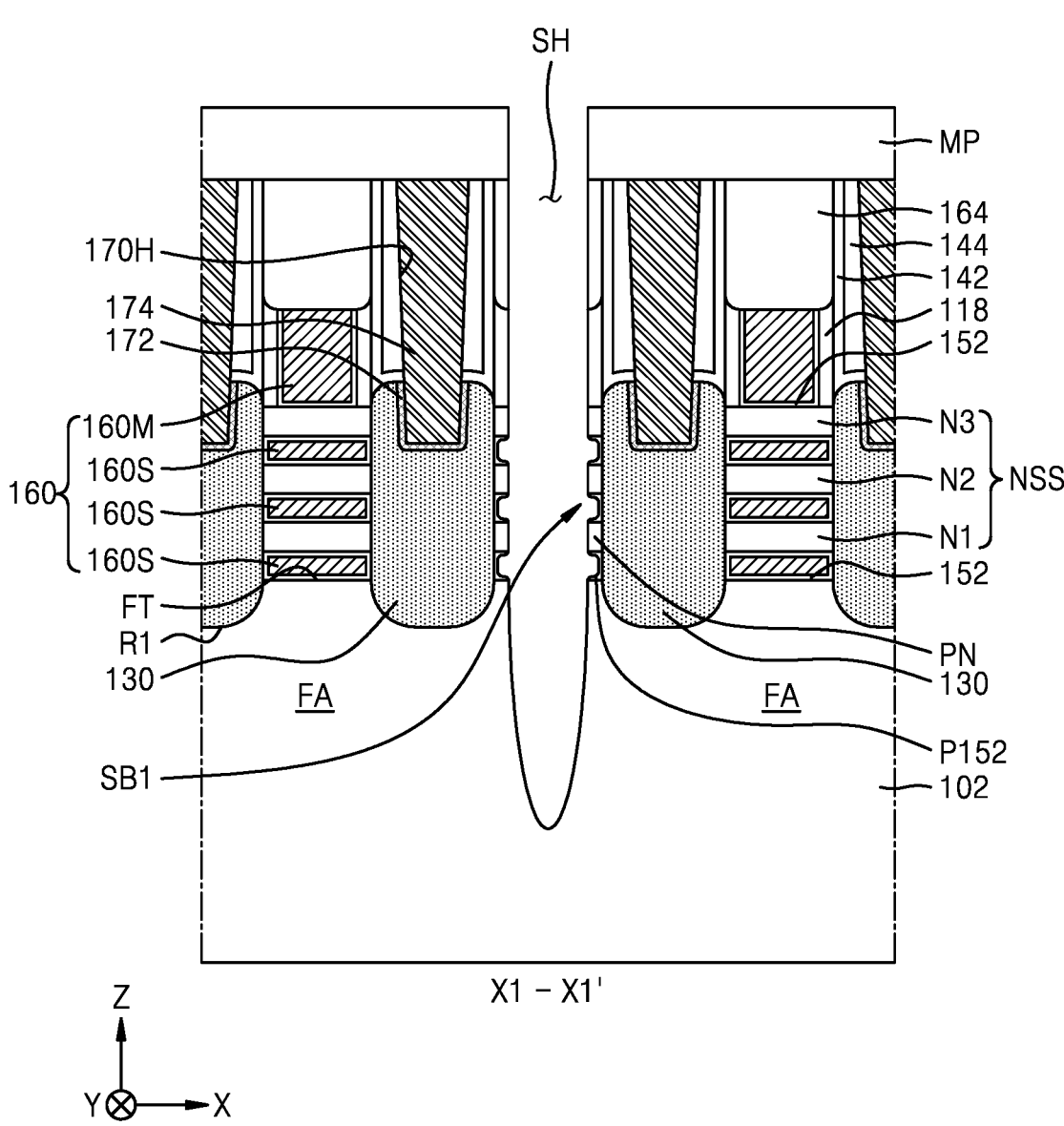

Referring to FIG. 6L, a mask pattern MP may be formed on the resulting product of FIG. 6K to expose the capping insulating pattern 164 that covers one gate line 160 selected from the plurality of gate lines 160, and exposed portions may be sequentially etched by using the mask pattern MP as an etch mask, thereby forming an isolation space SH to expose the substrate 102.

In some embodiments, to form the isolation space SH, the isolation space SH may be formed over the nanosheet stack NSS by removing the capping insulating pattern 164, which is exposed by the mask pattern MP, and the main gate portion 160M of the gate line 160 under the capping insulating pattern 164, followed by partially etching each of the nanosheet stack NSS, the plurality of sub-gate portions 160S, and the gate dielectric film 152 between the nanosheet stack NSS and the plurality of sub-gate portions 160S, which are exposed by the isolation space SH, and then, a portion of the substrate 102, which is exposed as a result thereof, may be etched, thereby expanding the isolation space SH in the vertical direction (Z direction).

During the formation of the isolation space SH, the plurality of sub-gate portions 160S and the gate dielectric film 152 covering the plurality of sub-gate portions 160S, both exposed by the isolation space SH, may be partially removed. As a result, after the isolation space SH is formed, a plurality of nanosheet pieces PN, which include respective remaining portions of the first nanosheet N1, the second nanosheet N2, and the third nanosheet N3, and a plurality of dielectric film pieces P152, which include remaining portions of the gate dielectric film 152, may be exposed in the isolation space SH. However, structures remaining in a resulting product, in which the isolation space SH is formed, are not limited to the example shown in FIG. 6L. For example, during the formation of the isolation space SH, the gate dielectric film 152 exposed by the isolation space SH may be completely removed, and thus, a portion of the source/drain region 130 may be exposed in the isolation space SH.

After the isolation space SH is formed, due to components including various materials exposed in the isolation space SH, an uneven surface SB1 may be formed at inner sidewalls of some regions of the isolation space SH. The uneven surface SB1 may be in the same vertical level region as a vertical level region in which the source/drain region 130 is arranged.

Figure 6M:
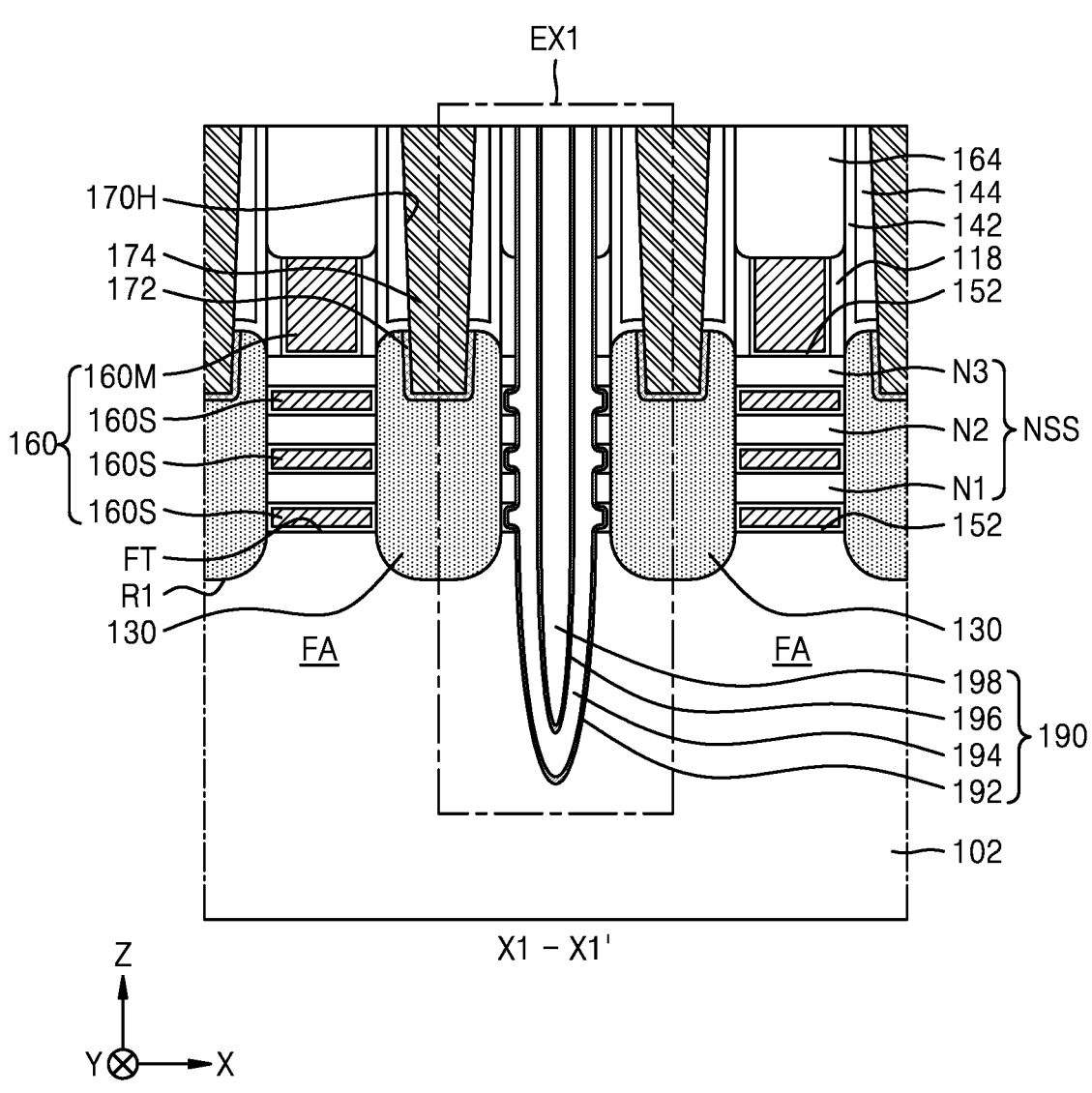

Referring to FIG. 6M, in a resulting product of FIG. 6L, the fin isolation insulator 190 may be formed to fill the isolation space SH, and a resulting product obtained by removing the mask pattern MP may be planarized.

FIGS. 7A to 7E are cross-sectional views respectively illustrating a sequence of processes of an example of a method of forming the fin isolation insulator 190 by a method according to some embodiments. FIGS. 7A to 7E illustrate enlarged cross-sectional structures of components in a region corresponding to a local region EX1 of FIG. 6M, according to the sequence of processes, respectively. In FIGS. 7A to 7E, the same reference numerals as in FIGS. 2A to 2C respectively denote the same members, and here, repeated descriptions thereof are omitted.

Figure 7A:
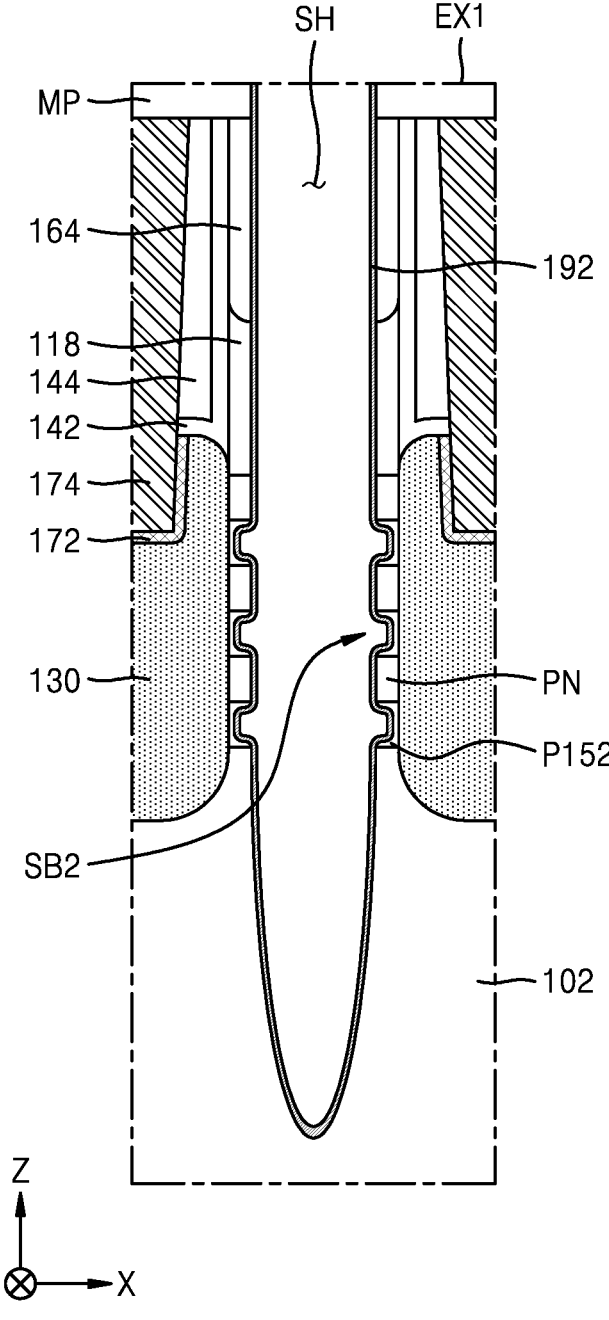
FIGS. 7A to 7E are cross-sectional views respectively illustrating a sequence of processes of an example of a method of forming a fin isolation insulator by a method according to some embodiments.

Referring to FIG. 7A, by performing a decoupled plasma nitridation (DPN) process on the resulting product of FIG.

6L, the first nitrogen-rich barrier film 192 may be formed along surfaces exposed by the isolation space SH in the resulting product of FIG. 6L.

Although FIG. 7A illustrates an example in which the first nitrogen-rich barrier film 192 is formed on the surfaces exposed by the isolation space SH in the resulting product of FIG. 6L, the inventive concept is not limited thereto. In some embodiments, the first nitrogen-rich barrier film 192 may include portions into which nitrogen atoms are injected by the DPN process in some regions adjacent to a surface of each of the components exposed by the isolation space SH in the resulting product of FIG. 6L, and portions having increased volumes due to the injection of the nitrogen atoms in each of the components to expand towards the inside of the isolation space SH.

In some embodiments, the DPN process may be performed by exposing the resulting product of FIG. 6L to a plasma atmosphere of a process gas selected from $N_2$, $NH_3$, $N_2O$, $NF_3$, NO, or a combination thereof. In some embodiments, the process gas may further include He gas. In some embodiments, the DPN process may be performed for about 5 seconds to about 5 minutes, but the inventive concept is not limited thereto. The DPN process may be performed at a pressure of about 0.5 Torr or less, for example, about 10 mTorr to about 30 mTorr, and at a temperature of about 0° C. to about 500° C., for example, in a room temperature atmosphere selected from a range of about 10° C. to about 40° C. In some embodiments, while the DPN process is performed, an RF source power of about 100 W to about 1000 W may be applied to a reaction chamber in which the resulting product of FIG. 6L is loaded. The process gas may be supplied into the reaction chamber at a flow rate of about 10 sccm to about 500 sccm. In some embodiments, after the DPN process is performed, the method of forming the fin isolation insulator 190 may further include an annealing process for heat-treating a resulting product obtained by the DPN process, in an atmosphere selected from an $N_2$ atmosphere, an Ar atmosphere, a vacuum atmosphere, and an atmosphere of a combination gas of $N_2$ and Ar, or in an atmosphere including a combination thereof. The annealing process may be performed at a temperature of about 100° C. to about 800° C. for about 1 minute to about 30 minutes. In some embodiments, the annealing process may be omitted.

As shown in FIG. 7A, after the first nitrogen-rich barrier film 192 is formed along the surfaces exposed by the isolation space SH in the resulting product of FIG. 6L, an uneven surface SB2 may be formed in the surface of the first nitrogen-rich barrier film 192 exposed by the isolation space SH. The uneven surface SB2 may result from the transfer of the shape of the uneven surface SB1, which is included in the inner surface of the isolation space SH shown in FIG. 6L. Because the first nitrogen-rich barrier film 192 is formed on the uneven surface SB1, the degree of unevenness of the uneven surface SB2 of the first nitrogen-rich barrier film 192 may be alleviated, as compared with the degree of unevenness of the uneven surface SB1 before the first nitrogen-rich barrier film 192 is formed. That is, surface roughness of the uneven surface SB2 of the first nitrogen-rich barrier film 192 may be smaller than surface roughness of the uneven surface SB1 included in the inner surface of the isolation space SH.

Figure 7B:
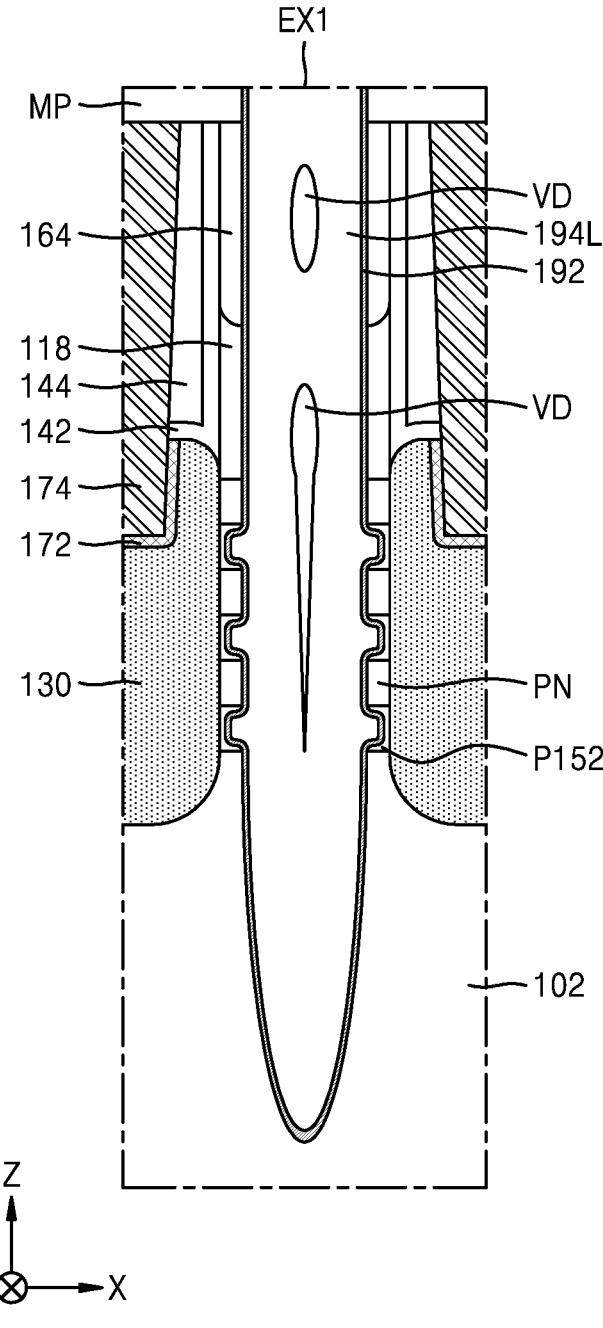

Referring to FIG. 7B, in a resulting product of FIG. 7A, a preliminary first isolation insulating film 194L may be formed on the first nitrogen-rich barrier film 192 to fill the isolation space SH.

In some embodiments, the preliminary first isolation insulating film 194L may include a silicon nitride film. To form the preliminary first isolation insulating film 194L, an ALD process may be used. While the silicon nitride film constituting the preliminary first isolation insulating film 194L is formed by the ALD process, source gases required to form the silicon nitride film may be easily adsorbed onto all regions of an inner exposed surface of the first nitrogen-rich barrier film 192, due to the nitrogen atoms included in the first nitrogen-rich barrier film 192 exposed by the isolation space SH. Therefore, even when the isolation space SH has a relatively high aspect ratio, the source gases required to form the silicon nitride film in the isolation space SH defined by the first nitrogen-rich barrier film 192 may be smoothly transferred to a lower portion of the isolation space SH, and the source gases required to form the silicon nitride film may be uniformly adsorbed onto the surface of the first nitrogen-rich barrier film 192 throughout the total length, in the vertical direction (Z direction), of the isolation space SH defined by the first nitrogen-rich barrier film 192. Therefore, portions of the preliminary first isolation insulating film 194L, which are adjacent to the first nitrogen-rich barrier film 192, may have a dense structure without voids. As shown in FIG. 7B, although there may be voids VD in a central portion of the isolation space SH, this is only an example, and the voids VD may not be formed in the preliminary first isolation insulating film 194L.

Figure 7C:
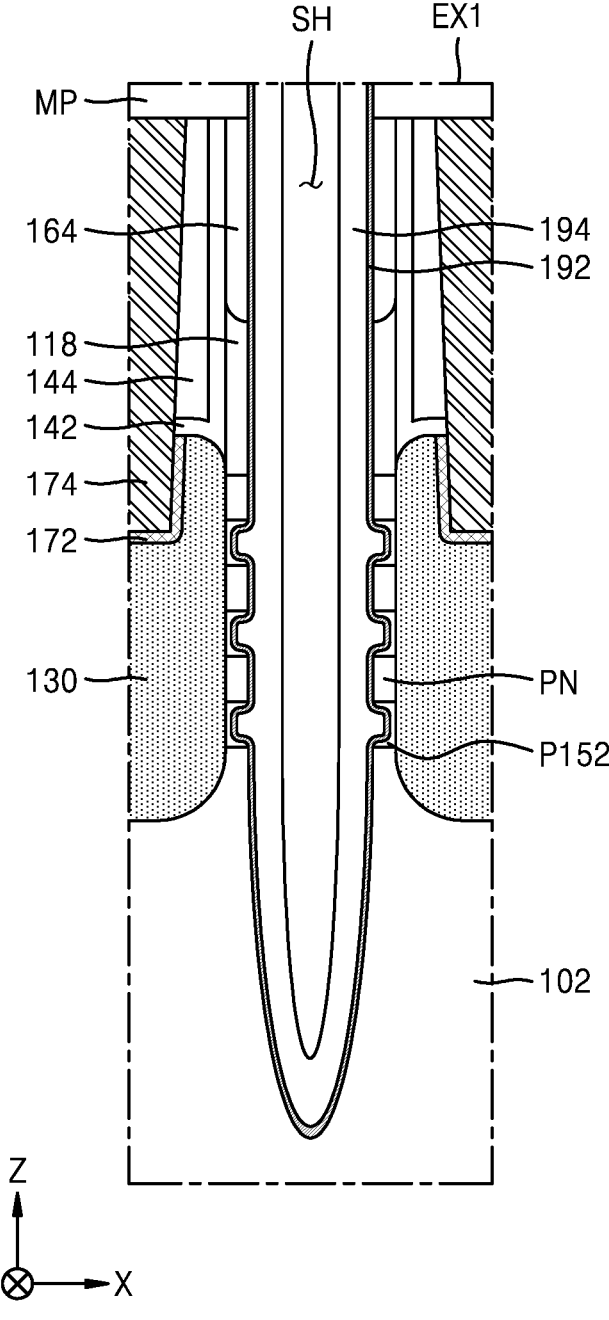

Referring to FIG. 7C, in a resulting product of FIG. 7B, the preliminary first isolation insulating film 194L may be partially removed by a dry etching process. As a result, a central portion of the preliminary first isolation insulating film 194L, in which there may be the voids VD, may be removed, and the first isolation insulating film 194, which includes only a dense portion of the preliminary first isolation insulating film 194L in the isolation space SH, may remain. An inner surface of the first isolation insulating film 194, which is exposed by the isolation space SH, may have a smooth surface without protrusions or uneven portions. In particular, a local region of the first isolation insulating film 194, which is located in a vertical level region where the source/drain region 130 is arranged, may have a smooth surface extending flat in the vertical direction (Z direction) without protrusions or uneven portions.

Figure 7D:
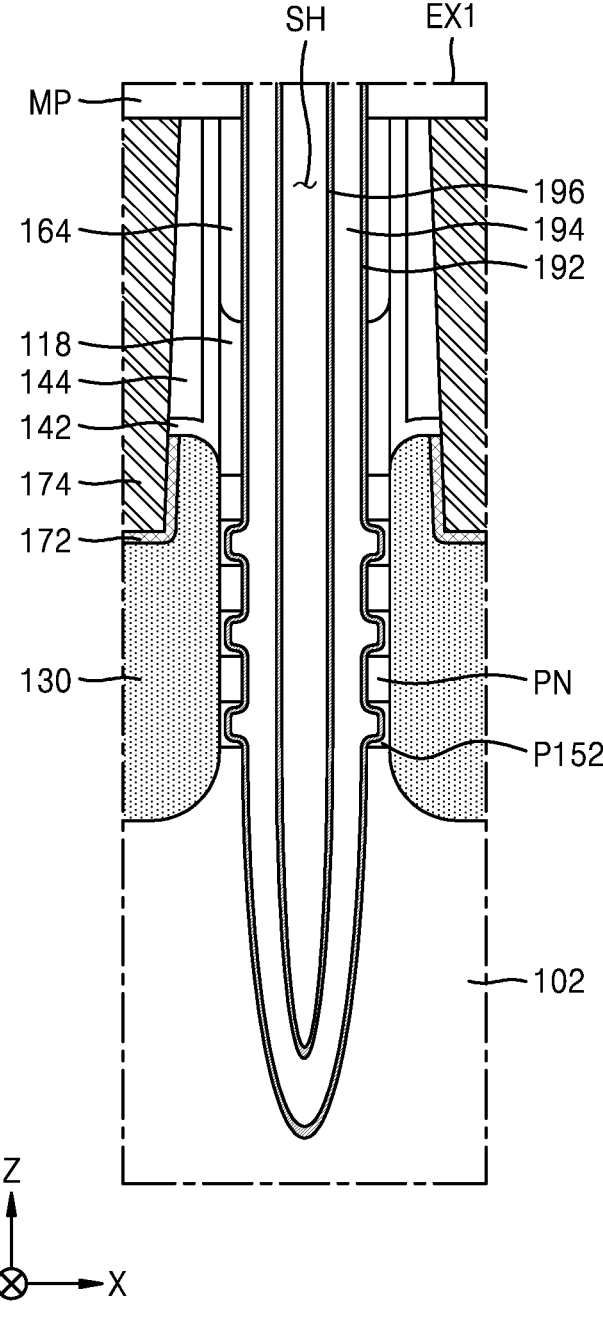

Referring to FIG. 7D, in a resulting product of FIG. 7C, by performing a DPN process on the inner surface of the first isolation insulating film 194, which is exposed by the isolation space SH, under conditions that are the same as or similar to those described with reference to FIG. 7A, the second nitrogen-rich barrier film 196 may be formed to extend along the inner surface of the first isolation insulating film 194, which is exposed by the isolation space SH.

A local region of an exposed surface of the second nitrogen-rich barrier film 196, which is located in the vertical level region where the source/drain region 130 is arranged, may have a smooth surface without protrusions or uneven portions.

Figure 7E:
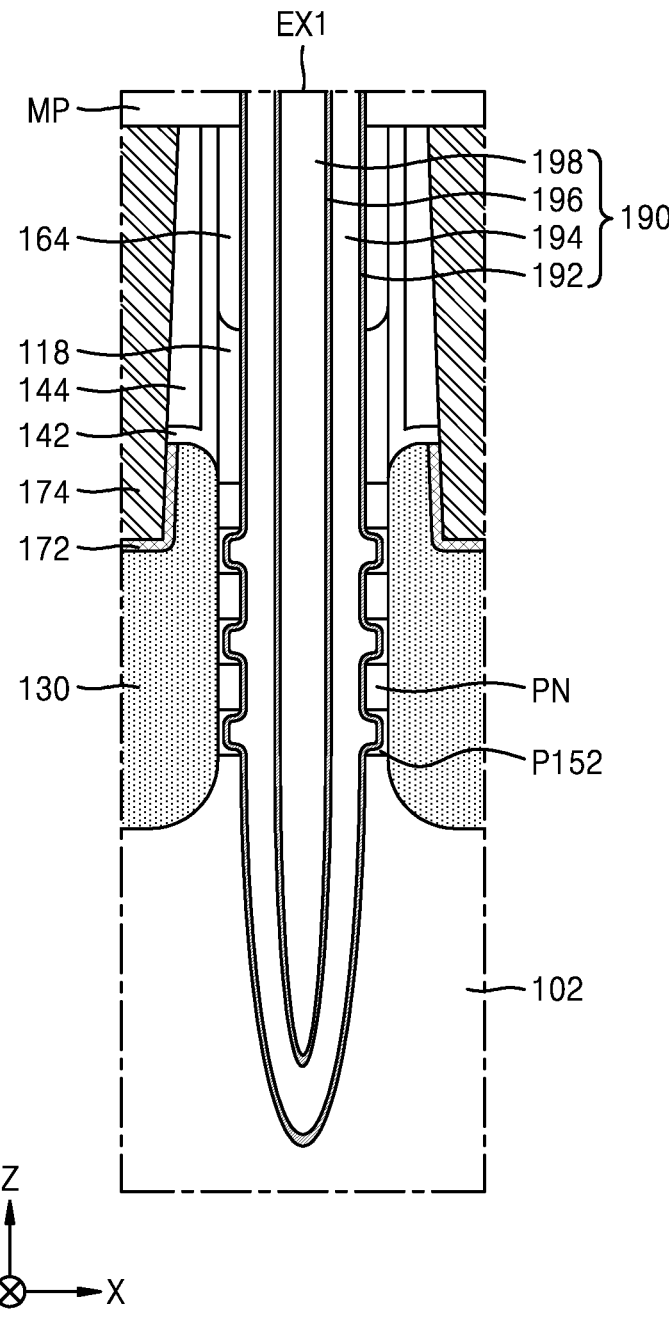

Referring to FIG. 7E, the second isolation insulating film 198 may be formed on the second nitrogen-rich barrier film 196 to fill the isolation space SH.

In some embodiments, the second isolation insulating film 198 may include a silicon nitride film. To form the second isolation insulating film 198, an ALD process may be used. While the silicon nitride film constituting the second isolation insulating film 198 is formed by the ALD process, source gases required to form the silicon nitride film may be easily adsorbed onto all regions of an inner exposed surface of the second nitrogen-rich barrier film 196, due to the nitrogen atoms included in the second nitrogen-rich barrier film 196 exposed by the isolation space SH. Therefore, even when the isolation space SH has a relatively high aspect ratio, the source gases required to form the silicon nitride film in the isolation space SH defined by the second nitrogen-rich barrier film 196 may be smoothly transferred to the lower portion of the isolation space SH, and the source gases required to form the silicon nitride film may be uniformly adsorbed onto the surface of the second nitrogen-rich barrier film 196 throughout the total length, in the vertical direction (Z direction), of the isolation space SH defined by the second nitrogen-rich barrier film 196. Therefore, the second isolation insulating film 198 having a dense structure without voids may be obtained.

Next, as described with reference to FIG. 6M, by removing the mask pattern MP and planarizing an upper surface of the resulting product in which the second isolation insulating film 198 is formed, the integrated circuit device 100 including the fin isolation insulator 190 shown in FIGS. 1 and 2A to 2C may be fabricated.

According to the method of fabricating the integrated circuit device 100, which is described with reference to FIGS. 6A to 6M and FIGS. 7A to 7E, when the fin isolation insulator 190 is formed, the degree of unevenness of the uneven surface SB1 (see FIG. 6L) at the inner sidewall of the isolation space SH after the formation of the isolation space SH exposing the substrate 102 may be alleviated during the DPN process and thus reduced from the surface roughness of the uneven surface SB1. In addition, due to the first nitrogen-rich barrier film 192 and the second nitrogen-rich barrier film 196, which are obtained through a plurality of DPN processes, the first isolation insulating film 194 and the second isolation insulating film 198 respectively formed on the first nitrogen-rich barrier film 192 and the second nitrogen-rich barrier film 196 may have dense structures without the voids VD. Therefore, the reliability of the fin isolation insulator 190 formed in the isolation space SH may improve, and the reliability of the integrated circuit 100 including the fin isolation insulator 190 may improve.

Heretofore, while the examples of the methods of fabricating the integrated circuit device 100 shown in FIGS. 1 and 2A to 2C have been described with reference to FIGS. 6A to 6M and 7A to 7E, it will be understood by those of ordinary skill in the art that, by making various modifications and changes to the examples described with reference to FIGS. 6A to 6M and 7A to 7E without departing from the spirit and scope of the inventive concept, the integrated circuit devices 200A, 200B, and 200C respectively shown in FIGS. 3 to 5 and integrated circuit devices having various structures modified and changed therefrom may be fabricated.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a pair of fin-type active regions, which extend in a first horizontal direction on a substrate; and
   a fin isolation insulator between ones of the pair of fin-type active regions, wherein the fin isolation insulator extends in a second horizontal direction that intersects with the first horizontal direction,
   wherein the fin isolation insulator comprises:
   a first nitrogen-rich barrier film having at least one protrusion at a position that is higher than respective top surfaces of each of the pair of fin-type active regions with respect to the substrate; and a second nitrogen-rich barrier film, which is spaced apart from the first nitrogen-rich barrier film and is in a space defined by the first nitrogen-rich barrier film, wherein, in the fin isolation insulator, each of the first nitrogen-rich barrier film and the second nitrogen-rich barrier film has a U-shaped cross-section, and the second nitrogen-rich barrier film is in a space defined by the first nitrogen-rich barrier film.

2. The integrated circuit device of claim 1, wherein an uppermost surface of the first nitrogen-rich barrier film is at a same vertical level as that of an uppermost surface of the second nitrogen-rich barrier film with respect to the substrate, and wherein a vertical level of a lowermost surface of the first nitrogen-rich barrier film is lower than that of a lowermost surface of the second nitrogen-rich barrier film with respect to the substrate.

3. The integrated circuit device of claim 1, wherein the first nitrogen-rich barrier film comprises a nitrogen-doped silicon oxide film, a nitrogen-rich silicon nitride film, a nitrogen-doped silicon film, or a combination thereof, and wherein the second nitrogen-rich barrier film comprises a nitrogen-rich silicon nitride film.

4. The integrated circuit device of claim 1, further comprising:

at least one nanosheet on a first fin-type active region of the pair of fin-type active regions;

a gate line on the first fin-type active region, wherein the gate line surrounds the at least one nanosheet in plan view and extends in the second horizontal direction; and a source/drain region on the first fin-type active region between the gate line and the fin isolation insulator, wherein the at least one protrusion faces the source/drain region in the first horizontal direction.

5. The integrated circuit device of claim 1, wherein the fin isolation insulator further comprises:

a first isolation insulating film, which is between the first nitrogen-rich barrier film and the second nitrogen-rich barrier film and is surrounded by the first nitrogen-rich barrier film in a plan view; and a second isolation insulating film, which is spaced apart from the first isolation insulating film with the second nitrogen-rich barrier film therebetween, and is surrounded by the second nitrogen-rich barrier film in the plan view, wherein the first nitrogen-rich barrier film comprises a nitrogen-doped silicon oxide film, a nitrogen-rich silicon nitride film, a nitrogen-doped silicon film, or a combination thereof, wherein the second nitrogen-rich barrier film comprises a nitrogen-rich silicon nitride film, and wherein each of the first isolation insulating film and the second isolation insulating film comprises a silicon nitride film in which an atomic ratio of silicon atoms to nitrogen atoms is 3:4.

6. The integrated circuit device of claim 1, wherein the fin isolation insulator further comprises:

a first isolation insulating film, which is between the first nitrogen-rich barrier film and the second nitrogen-rich barrier film and has a U-shaped cross-section; and a second isolation insulating film, which is spaced apart from the first isolation insulating film with the second nitrogen-rich barrier film therebetween, and has a portion comprising insulating material.

7. The integrated circuit device of claim 1, wherein the fin isolation insulator further comprises:

a first isolation insulating film between the first nitrogen-rich barrier film and the second nitrogen-rich barrier film; and a second isolation insulating film spaced apart from the first isolation insulating film with the second nitrogen-rich barrier film therebetween, wherein the first nitrogen-rich barrier film, the first isolation insulating film, the second nitrogen-rich barrier film, and the second isolation insulating film are sequentially stacked in the first horizontal direction from an outermost portion of the fin isolation insulator toward a central portion of the fin isolation insulator, and wherein respective uppermost surfaces of the first nitrogen-rich barrier film, the first isolation insulating film, the second nitrogen-rich barrier film, and the second isolation insulating film are at a same vertical level with respect to the substrate.

8. The integrated circuit device of claim 1, wherein the second nitrogen-rich barrier film has a local region facing the at least one protrusion of the first nitrogen-rich barrier film, and wherein the local region of the second nitrogen-rich barrier film is substantially flat.

9. The integrated circuit device of claim 1, wherein the fin isolation insulator comprises a lower isolation portion that penetrates the substrate, and wherein in the first horizontal direction, the lower isolation portion has a smaller width than upper portions of the fin isolation insulator.

10. The integrated circuit device of claim 1, further comprising:

a dummy gate line that extends in the second horizontal direction from the fin isolation insulator.

11. An integrated circuit device comprising:

a pair of fin-type active regions, which extend in a first horizontal direction on a substrate;

a fin isolation insulator between ones of the pair of fin-type active regions, and extends in a second horizontal direction that intersects with the first horizontal direction;

a pair of nanosheet stacks on respective ones of the pair of fin-type active regions, wherein each of the pair of nanosheet stacks comprises at least one nanosheet;

a pair of gate lines on the respective ones of the pair of fin-type active regions, wherein the pair of gate lines extend around the at least one nanosheet in a plan view and extend in the second horizontal direction; and a pair of source/drain regions respectively on opposing sides of the fin isolation insulator between the pair of gate lines, wherein the fin isolation insulator comprises:

a first nitrogen-rich barrier film comprising a first local region that has at least one protrusion facing at least one of the pair of source/drain regions; and a second nitrogen-rich barrier film, which is spaced apart from the first nitrogen-rich barrier film and is in a space defined by the first nitrogen-rich barrier film.

12. The integrated circuit device of claim 11, wherein the fin isolation insulator has a planar structure of a linear shape and extends parallel to the pair of gate lines in the second horizontal direction.

13. The integrated circuit device of claim 11, wherein the second nitrogen-rich barrier film comprises a second local region facing the first local region in the first horizontal direction, and wherein surface roughness of the second local region is less than surface roughness of the first local region.

14. The integrated circuit device of claim 11, wherein the fin isolation insulator further comprises:

a first isolation insulating film between the first nitrogen-rich barrier film and the second nitrogen-rich barrier film; and a second isolation insulating film, which is surrounded by the second nitrogen-rich barrier film in the plan view and spaced apart from the first isolation insulating film with the second nitrogen-rich barrier film therebetween, wherein respective uppermost surfaces of the first nitrogen-rich barrier film, the second nitrogen-rich barrier film, the first isolation insulating film, and the second isolation insulating film are on a same plane with respect to the substrate.

15. The integrated circuit device of claim 11, further comprising:

a dummy gate line that extends in the second horizontal direction from the fin isolation insulator, wherein, in the first horizontal direction, a first distance between the dummy gate line and a first gate line of the pair of gate lines is equal to a second distance between the dummy gate line and a second gate line of the pair of gate lines.

16. The integrated circuit device of claim 11, wherein the fin isolation insulator comprises:

a lower isolation portion that penetrates the substrate at a position that is lower that a lowermost portion of the pair of source/drain regions with respect to the substrate; and an upper isolation portion that is between the pair of gate lines in the first horizontal direction, wherein, in the first horizontal direction, the lower isolation portion has a smaller width than the upper isolation portion.

17. An integrated circuit device comprising:

a first fin-type active region and a second fin-type active region, which extend in a first horizontal direction on a substrate;

a fin isolation insulator between the first fin-type active region and the second fin-type active region, wherein the fin isolation insulator extends in a second horizontal direction that intersects with the first horizontal direction;

at least one nanosheet on the first fin-type active region;

a gate line on the first fin-type active region, wherein the gate line extends around the at least one nanosheet in a plan view and extends in the second horizontal direction; and a source/drain region on the first fin-type active region between the gate line and the fin isolation insulator, wherein the fin isolation insulator comprises a first nitrogen-rich barrier film, a first isolation insulating film, a second nitrogen-rich barrier film, and a second isolation insulating film, which are sequentially stacked from an outermost portion of the fin isolation insulator toward a central portion of the fin isolation insulator, wherein the first nitrogen-rich barrier film has at least one protrusion in a local region thereof facing the source/drain region, and wherein the second nitrogen-rich barrier film is spaced apart from the first nitrogen-rich barrier film with the first isolation insulating film therebetween, and has a smooth surface facing the local region of the first nitrogen-rich barrier film.

18. The integrated circuit device of claim 17, wherein the fin isolation insulator comprises a lower isolation portion that is lower than the source/drain region with respect to the substrate, and wherein, in the lower isolation portion, the first nitrogen-rich barrier film and the second nitrogen-rich barrier film comprise different materials from each other, and the first isolation insulating film and the second isolation insulating film comprise a same material.

19. The integrated circuit device of claim 17, wherein each of the first nitrogen-rich barrier film, the first isolation insulating film, and the second nitrogen-rich barrier film has a U-shaped cross-section, and wherein the second isolation insulating film has portion comprising an insulating material.

* * * * *